United States Patent
Muraoka et al.

(10) Patent No.: US 8,018,761 B2
(45) Date of Patent: Sep. 13, 2011

(54) RESISTANCE VARIABLE ELEMENT, RESISTANCE VARIABLE MEMORY APPARATUS, AND RESISTANCE VARIABLE APPARATUS

(75) Inventors: Shunsaku Muraoka, Osaka (JP); Koichi Osano, Osaka (JP); Satoru Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 269 days.

(21) Appl. No.: 12/519,476

(22) PCT Filed: Dec. 20, 2007

(86) PCT No.: PCT/JP2007/074559
§ 371 (c)(1),
(2), (4) Date: Jun. 16, 2009

(87) PCT Pub. No.: WO2008/081742
PCT Pub. Date: Jul. 10, 2008

(65) Prior Publication Data
US 2010/0027320 A1    Feb. 4, 2010

(30) Foreign Application Priority Data
Dec. 28, 2006   (JP) ................... 2006-354208

(51) Int. Cl.
*G11C 11/00* (2006.01)
(52) U.S. Cl. ......... 365/163; 365/113; 365/100; 365/148
(58) Field of Classification Search .................. 365/163, 365/100, 148
See application file for complete search history.

(56) References Cited

U.S. PATENT DOCUMENTS
6,204,139 B1 * 3/2001 Liu et al. ................. 438/385
2006/0120205 A1   6/2006 Odagawa et al.
2007/0196696 A1   8/2007 Osano et al.

FOREIGN PATENT DOCUMENTS
| JP | 2004-342843 | 12/2004 |
| JP | 2004-363604 | 12/2004 |
| JP | 2005-317787 | 11/2005 |
| JP | 2006-080259 | 3/2006 |
| JP | 2006-319166 | 11/2006 |
| WO | WO 2005/101420 A1 | 10/2005 |
| WO | WO 2006/028117 A1 | 3/2006 |

* cited by examiner

*Primary Examiner* — Jason Lappas
(74) *Attorney, Agent, or Firm* — McDermott Will & Emery LLP

(57) ABSTRACT

A resistance variable element (10), a resistance variable memory apparatus, and a resistance variable apparatus, comprise a first electrode (2), a second electrode (4), and a resistance variable layer (3) which is disposed between the first electrode (2) and the second electrode (4) and is electrically connected to the first electrode (2) and to the second electrode (4), wherein the resistance variable layer (3) contains a material having a spinel structure which is expressed as a chemical formula of $(Ni_xFe_{1-x}) Fe_2O_4$, X being not smaller than 0.35 and not larger than 0.9, wherein the resistance variable element has a characteristic in which an electric resistance between the first electrode (2) and the second electrode (4) decreases by application of a first voltage pulse having a first voltage between the first electrode (2) and the second electrode (4) and increases by application of a second voltage pulse having a second voltage which is different in polarity from the first voltage between the first electrode (2) and the second electrode (4).

13 Claims, 13 Drawing Sheets

RESISTANCE VARIABLE ELEMENT, RESISTANCE VARIABLE MEMORY APPARATUS, AND RESISTANCE VARIABLE APPARATUS

RELATED APPLICATIONS

This application is the U.S. National Phase under 35 U.S.C. §371 of International Application No. PCT/JP2007/074559, filed on Dec. 20, 2007, which in turn claims the benefit of Japanese Application No. 2006-354208, filed on Dec. 28, 2006, the disclosures of which Applications are incorporated by reference herein.

TECHNICAL FIELD

The present invention relates to a resistance variable element, a resistance variable memory apparatus, and a resistance variable apparatus. More particularly, the present invention relates to a resistance variable element whose electric resistance changes in response to voltage pulses applied, a resistance variable memory apparatus using the resistance variable element, and a resistance variable apparatus using the resistance variable element.

BACKGROUND ART

In advancement of digital technologies of electronic devices, there has been an increasing demand for a larger capacity of a nonvolatile resistance variable element, reduction of a write electric power in the element, reduction of write/read time in the element, and a longer life of the element to store data of images and so on. It is said that in response to such a demand, there is a limitation in miniaturization of a FLASH memory using the existing floating gate.

As a first prior art which possibly meets such a demand, there has been proposed a nonvolatile resistance variable element using perovskite materials (e.g., $Pr_{(1-x)}Ca_xMnO_3$ [PCMO], $LaSrMnO_3$ [LSMO], $GdBaCo_xO_y$ [GBCO] or the like) (see Patent document 1). This technique is such that the perovskite material is applied with predetermined voltage pulses (wave-shaped voltages which are short in duration) which are different in polarity (or are the same in polarity and different in voltage values) to increase or decrease its resistance value and the changed resistance value is caused to correspond to data, thereby storing data.

As a second prior art, there is a nonvolatile resistance variable element making the use of an event that a resistance value of a layer of a transition metal oxide (NiO, $V_2O$, ZnO, $Nb_2O_5$, $TiO_2$, $WO_3$, or CoO) is changed by applying the above mentioned voltage pulses to the transition metal oxide layer (see Patent document 2).

As a third prior art, there is a nonvolatile resistance variable element in which an amorphous oxide (e.g., oxide of one or more elements selected from Ti, V, Fe, Co, Y, Zr, Nb, Mo, Hf, Ta, W, Ge, and Si) is provided with Ag or Cu electrode and is applied with a voltage to allow the electrode material Ag or Cu to be ionized and diffuse into a thin layer, thereby changing the resistance value of the amorphous oxide (see patent document 3).

As a fourth prior art, there is proposed a resistance variable element which includes a material layer having a spinel structure which is sandwiched between electrodes and is configured to change to a high-resistance state and a low-resistance state in response to electric pulses which are different in polarity (bipolar-driven) (Patent documents 4 and 5).

By using the above mentioned resistance variable materials as memory cells and combining them with transistors for selecting respective memory cells, the operation of the nonvolatile resistance variable element is attained.

Patent document 1: U.S. Pat. No. 6,204,139
Patent document 2: Japanese Laid-Open Patent Application Publication No. 2004-363604
Patent document 3: Japanese Laid-Open Patent Application Publication No. 2004-342843
Patent document 4: Japanese Laid-Open Patent Application Publication No. 2005-317787
Patent document 5: Japanese Laid-Open Patent Application Publication No. 2006-080259

DISCLOSURE OF THE INVENTION

Problems to be Solved by the Invention

However, in the first prior art, stability and reproducibility of the operation are not sufficient. An oxide crystal having the perovskite structure such as $(Pr_{0.7}Ca_{0.3}MnO_3)$ typically requires a high temperature of 650° C. to 850° C. for crystallization, and therefore other materials may be deteriorated if it is used in a semiconductor manufacture process.

In the second prior art and the fourth prior art, the operation called "forming" for applying a high voltage to the resistance variable element after manufacture (layer forming) to enable the resistance variable layer to stably have a predetermined resistance value. The second prior art and the fourth prior art have a problem that since the "forming" process must be performed for each element, a long time is needed in manufacture of a resistance variable memory apparatus including numerous elements, or the like. In addition, the second prior art has a problem that since it is necessary to apply a voltage pulse having a long pulse width of millisecond order to change (reset) the resistance variable element from the low-resistance state to the high-resistance state, write speed (storing speed) at which the resistance variable element is changed from the low-resistance state to the high-resistance state is very slow.

The third prior art has a problem that since the resistance variable layer has the amorphous structure, the resistance variable layer may be crystallized and its characteristics may change after a long-time use.

The present invention is directed to solving the above mentioned problems associated with the prior arts. An object of the present invention is to provide a resistance variable element, a resistance variable memory apparatus, and a resistance variable apparatus which are manufactured at a low temperature, dispense with "forming," change from a low-resistance state to a high-resistance state at a high write speed, and have high stability.

Means for Solving the Problems

The present inventors intensively studied the materials used for the resistance variable layer of the resistance variable element. As a result, it was revealed that when using a resistance variable material which is mainly composed of $Fe_3O_4$, the write speed at which the resistance variable element is changed from the low-resistance state to the high-resistance state can be made higher. However, it was also revealed that the use of $Fe_3O_4$ requires "forming."

The present inventors intensively studied a technique which can dispense with the "forming" when using $Fe_3O_4$ as the resistance variable material. As a result, it was revealed that the resistance value rises by mixing Ni or Zn as impurity with $Fe_3O_4$, and the "forming" can be dispensed with. In addition, it was revealed that in the configuration using the material containing Ni or Zn, the manufacturing temperature is low (e.g., 300° C. or lower), the write speed at which the resistance variable element is changed from the low-resistance state to the high-resistance state is high (about 100 ns), and a long data retention characteristic is obtained.

As a result of consideration based on the results obtained, it may be presumed that the same advantage can be achieved using materials other than Ni and Zn, such as Cu, Mn, or Co.

That is, a resistance variable element of the present invention comprises a first electrode; a second electrode; and a resistance variable layer which is disposed between the first electrode and the second electrode and is electrically connected to the first electrode and to the second electrode; wherein the resistance variable layer contains a material having a spinel structure which is expressed as a chemical formula of $(Ni_xFe_{1-x}) Fe_2O_4$, X being not smaller than 0.35 and not larger than 0.9; and wherein the resistance variable element has a characteristic in which an electric resistance between the first electrode and the second electrode decreases by application of a first voltage pulse having a first voltage between the first electrode and the second electrode and increases by application of a second voltage pulse having a second voltage which is different in polarity from the first voltage between the first electrode and the second electrode.

In such a configuration, it is possible to provide a resistance variable element which is manufactured at a low temperature, dispenses with "forming," changes from a low-resistance state to a high-resistance state at a high write speed, and has high stability.

In the above resistance variable element, the material expressed as the chemical formula may have a resistivity which is not smaller than 0.5 $\Omega$cm and not larger than 100 $\Omega$cm.

In such a configuration, it is possible to provide a resistance variable element which is manufactured at a low temperature, dispenses with "forming," changes from a low-resistance state to a high-resistance state at a high write speed, and has high stability, by controlling the resistivity to fall within a predetermined range.

In the above resistance variable element, at least one of the first electrode and the second electrode may be an electrode comprising one or plural materials selected from a group consisting of Ag, Au, Pt, Ru, $RuO_2$, Ir, $IrO_2$, TiO, TiN, TiAlN, Ta, and TaN.

In such a configuration, the resistance variable element can be formed to include the electrode made of a specified metal.

In the above resistance variable element, the resistance variable layer may have a thickness which is not smaller than 10 nm and not larger than 200 nm.

In such a configuration, the resistance variable layer is easily processed using lithography in a patterning process, and the voltage value of the voltage pulse for changing the resistance value of the resistance variable element can be lowered. In addition, it is possible to more surely avoid breakdown (insulation breakdown) occurring when applying the voltage.

A resistance variable memory apparatus of the present invention comprises the aforesaid resistance variable element; and a voltage pulse application device; wherein the voltage pulse application device is configured to apply a predetermined voltage pulse between the first electrode and the second electrode to cause 1-bit data or multi-valued data to be stored in the resistance variable element according to a change in the resistance value.

In such a configuration, the data can be stored in the resistance variable element using the voltage pulse applied by the voltage pulse application device. As a result, it is possible to provide a resistance variable memory apparatus which is manufactured at a low temperature, dispenses with "forming," changes from a low-resistance state to a high-resistance state at a high write speed, and has high stability.

In the above resistance variable memory apparatus, the voltage pulse application device may be configured to apply a positive voltage pulse between the first electrode and the second electrode to cause the resistance variable element to change to the low-resistance state, and to apply a negative voltage pulse between the first electrode and the second electrode to cause the resistance variable element to change to the high-resistance state, to store 1-bit data by causing the data to correspond to the resistance state of the resistance variable element.

In such a configuration, the data can be stored in the resistance variable element using the positive and negative voltage pulses applied by the voltage pulse application device. As a result, it is possible to provide a resistance variable memory apparatus which is manufactured at a low temperature, dispenses with "forming," changes from a low-resistance state to a high-resistance state at a high write speed, and has high stability.

The above resistance variable memory apparatus may comprise a plurality of word lines extending in a first direction; a plurality of bit lines extending in a second direction so as to respectively cross the word lines; a plurality of plate lines extending in the second direction so as to respectively correspond to the plurality of bit lines; a plurality of transistors each including a first main terminal, a second main terminal and a control terminal, the transistors being provided to respectively correspond to cross points between the word lines and the bit lines; a plurality of resistance variable elements, each of which includes a first electrode, a second electrode, and a resistance variable layer disposed between the first electrode and the second electrode and electrically connected to the first electrode and to the second electrode, the resistance variable elements respectively corresponding to the transistors one by one; a word line drive unit which is connected to the plurality of word lines and configured to control application of a voltage to the word lines; a bit line/plate line drive unit which is connected to the plurality of bit lines and to the plurality of plate lines and configured to control application of a voltage to the bit lines and to the plate lines; and a control unit configured to control the word line drive unit and the bit line/plate line drive unit; wherein first main terminals of the transistors are respectively electrically connected to the bit lines extending through associated ones of the cross points; second main terminals of the transistors are respectively electrically connected to first electrodes of associated ones of the resistance variable elements; second electrodes of the resistance variable elements are respectively electrically connected to the plate lines extending through associated ones of the cross points; control terminals of the transistors are respectively electrically connected to the word lines extending through associated ones of the cross points; the resistance variable layer contains a material having a spinel structure which is expressed as a chemical formula of $(M'_xFe_{1-x}) Fe_2O_4$; and M' in the chemical formula is one or plural transition metals which are selected from a group consisting of Mn, Co, Ni, Cu and Zn.

In such a configuration, the resistance variable memory apparatus including the memory cell array including the resistance variable elements in respective cells is provided. As a result, it is possible to provide a resistance variable memory apparatus which has a high density, is manufactured at a low temperature, dispenses with "forming," changes from a low-resistance state to a high-resistance state at a high write speed, and has high stability.

In the resistance variable memory apparatus, the word line drive unit may be configured to selectively apply an activation voltage to one of the word lines which is connected to a gate of a transistor corresponding to a resistance variable element in which specified data is stored based on control of the control unit, the activation voltage causing a drain and a source of the transistor to be in an electrically-connected state; and the bit line/plate line drive unit may be configured to selectively apply a first voltage pulse to one of the bit lines which is connected to the transistor corresponding to the resistance variable element in which the specified data is to be stored based on the control of the control unit and is configured to apply a second voltage pulse to a plate line corresponding to the one of the bit lines based on the control of the control unit.

In such a configuration, the data can be stored in the resistance variable element using the voltage pulse applied based on control of the control unit. As a result, it is possible to provide a resistance variable memory apparatus which is manufactured at a low temperature, dispenses with "forming," changes from a low-resistance state to a high-resistance state at a high write speed, and has high stability.

In the above resistance variable memory apparatus, the word line drive unit may be configured to selectively apply an activation voltage to one of the word lines which is connected to a gate of a transistor corresponding to a resistance variable element from which specified data pre-stored is read based on control of the control unit, the activation voltage causing a drain and a source of the transistor to be in an electrically-connected state; and the bit line/plate line drive unit may be configured to selectively apply a first read voltage to one of the bit lines which is connected to the transistor corresponding to the resistance variable element from which the specified data is read based on the control of the control unit and is configured to apply a second read voltage to a plate line corresponding to the one of the bit lines based on the control of the control unit.

In such a configuration, the data stored in the resistance variable element can be read using the voltage applied based on control of the control unit. As a result, it is possible to provide a resistance variable memory apparatus which is manufactured at a low temperature, dispenses with "forming," changes from a low-resistance state to a high-resistance state at a high write speed, and has high stability.

A resistance variable apparatus of the present invention comprises one of the above resistance variable memory apparatuses; and a logic circuit configured to execute an operation process based on specified data; wherein the logic circuit has a write mode and a read mode. The logic circuit may be configured to, in the write mode, control the resistance variable memory apparatus to cause the data to be stored in the resistance variable memory apparatus, and is configured to, in the read mode, control the resistance variable memory apparatus to cause the data stored in the resistance variable memory apparatus to be read therefrom.

In such a configuration, by incorporating the logic circuit, it is possible to provide a resistance variable apparatus (Embedded-RAM) which is manufactured at a low temperature, dispenses with "forming," changes from a low-resistance state to a high-resistance state at a high write speed, and has high stability.

Or, a resistance variable apparatus of the present invention comprises one of the above resistance variable memory apparatuses; an input device for receiving an input from outside; and a processor which is communicatively connected to the input device; wherein the resistance variable memory apparatus is configured to store a program; wherein the processor has a program running mode and a program rewrite mode; and wherein the processor is configured to, in the program rewrite mode, rewrite the program stored in the resistance variable memory apparatus into a program received from outside via the input device, and is configured to, in the program running mode, to run the program stored in the resistance variable memory apparatus.

In such a configuration, by incorporating the input device and the processor, it is possible to provide a resistance variable apparatus (Reconfigurable-LSI) which is manufactured at a low temperature, dispenses with "forming," changes from a low-resistance state to a high-resistance state at a high write speed, and has high stability.

A method of storing data in a resistance variable element of the present invention comprises applying two kinds of voltage pulses which are different in polarity between the first electrode and the second electrode of the resistance variable element according to claim 1 to change a resistance state of the resistance variable element, to store data in the resistance variable element according to a change in the resistance state.

In such a configuration, the data can be stored in the resistance variable element using voltage pulses which are different in polarity. Therefore, by bipolar drive, it is possible to provide a memory apparatus using the resistance variable element which is manufactured at a low temperature, dispenses with "forming," changes from a low-resistance state to a high-resistance state at a high write speed, and has high stability.

Or, a method of storing data in a resistance variable element of the present invention comprises applying plural kinds of voltage pulses between the first electrode and the second electrode of the resistance variable element to change a resistance state of the resistance variable element, to store the data in the resistance variable element according to a change in the resistance state; wherein at least one of the plural kinds of voltage pulses is different in polarity from another voltage pulse.

In such a configuration, the data can be stored in the resistance variable element using the plural kinds of voltage pulses at least one of which is different in polarity from another. Therefore, by bipolar drive, it is possible to provide a memory apparatus using the resistance variable element which is a multi-valued memory element, is manufactured at a low temperature, dispenses with "forming," changes from a low-resistance state to a high-resistance state at a high write speed, and has high stability.

The above and further objects, features and advantages of the present invention will more fully be apparent from the following detailed description of preferred embodiments with accompanying drawings.

Effect of the Invention

The present invention has the above described configuration and has the advantages described below. That is, it is possible to provide a resistance variable element, a resistance variable memory apparatus, and a resistance variable apparatus which are manufactured at a low temperature, dispense with "forming," change from a low-resistance state to a high-resistance state at a high write speed, and have high stability.

Figure 1:
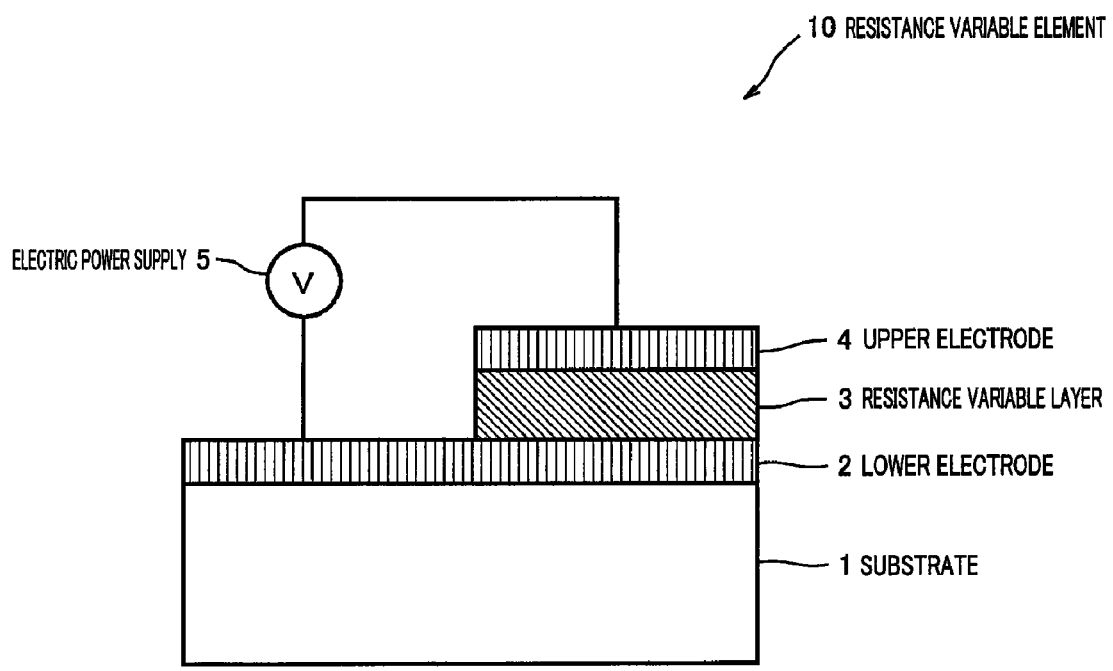
FIG. 1 is a schematic view showing an example of a configuration of a resistance variable element according to Embodiment 1 of the present invention.

EXPLANATION OF REFERENCE NUMERALS 1 substrate
2 lower electrode
3 resistance variable layer
4 upper electrode
5 electrode
10 resistance variable element
11 first terminal
12 second terminal
200 resistance variable memory apparatus
201 memory array
202 address buffer
203 control unit
204 row decoder
205 word line driver
206 column decoder
207 bit line/plate line driver
300 resistance variable apparatus
301 logic circuit
400 resistance variable apparatus
401 processor
402 interface
W1, W2 word line
B1, B2 bit line
P1, P2 plate line
T211, T212, T221, T222 transistor
MC211, MC212, MC221, MC222 memory cell
Swa, Swb switch

BEST MODE FOR CARRYING OUT THE INVENTION

Hereinafter, preferred embodiments of the present invention will be described with reference to the drawings.

Embodiment 1

Configuration

FIG. 1 is a schematic view showing an example of a configuration of a resistance variable element according to Embodiment 1 of the present invention.

As shown in FIG. 1, a resistance variable element 10 of this embodiment includes a substrate 1, a lower electrode 2 (first electrode) provided on the substrate 1, a resistance variable layer 3 provided on the lower electrode 2, and an upper electrode 4 (second electrode) provided on the resistance variable layer 3. The lower electrode 2 and the upper electrode 4 are respectively electrically connected to the resistance variable layer 3. Alternatively, the upper electrode 4 may be a first electrode and the lower electrode 2 may be a second electrode.

The substrate 1 is constituted by a silicon substrate, for example.

The lower electrode 2 and the upper electrode 4 are made of one or plural materials which are selected from a group consisting of, for example, Ag (silver), Au (gold), Pt (platinum), Ru (ruthenium), $RuO_2$ (ruthenium oxide), Ir (iridium), $IrO_2$ (iridium oxide), TiO (titanium oxide), TiN (titanium nitride), TiAlN (titanium aluminum nitride), Ta (tantalum), and TaN (tantalum nitride). These material are stable at temperatures of about 300° C. and are compatible with conditions for forming the resistance variable layer 3 as described later.

The resistance variable layer 3 is made of a material having a spinel structure which is expressed as a chemical formula of $(M'_x Fe_{1-x}) Fe_2 O_4$. M' is one or plural transition metals which are selected from a group consisting of Mn (manganese), Co (cobalt), Ni (nickel), Cu (copper), and Zn (zinc). That is, the material of the resistance variable layer 3 contains $Fe_3 O_4$ (triiron tetroxide) as a major component and predetermined transition metal as impurities. When the resistance variable layer 3 contains plural transition metals (other than Fe), X indicates the total of rates with which the respective transition metals (other than Fe) replace Fe sites in a crystal (see the above chemical formula).

It is desirable that the resistivity (volume resistivity) of the resistance variable layer 3 be not smaller than 0.5 Ωcm and not larger than 100 Ωcm. When M' is Ni, X (rate of Ni as an impurity) is desirably not smaller than 0.35 and not larger than 0.9.

It is desirable that the thickness of the resistance variable layer 3 be 1 μm or smaller. With such a structure, it is possible to well change the resistance value of the resistance variable element by application of the voltage pulses.

It is more desirable that the thickness of the resistance variable layer 3 be 200 nm or smaller. With such a structure, the resistance variable layer 3 can be easily processed when using lithography in a patterning process, and a voltage value of a voltage pulse for changing the resistance value of the resistance variable element can be lowered.

It is desirable that the thickness of the resistance variable layer 3 be at least 10 nm or larger. With such a structure, breakdown (insulation breakdown) can be more surely avoided when the voltage is applied.

To lower the voltage value of the voltage pulse for changing the resistance value of the resistance variable element, the thickness of the resistance variable layer 3 is desirably set as small as possible.

[Manufacturing Method]

Initially, by sputtering or the like, the lower electrode 2 (thickness: 0.2 μm, for example) is formed on the substrate 1. M'Fe$_2$O$_4$ target and Fe$_3$O$_4$ target are prepared. The respective targets are respectively caused to perform electric discharge simultaneously by the sputtering, forming on the lower electrode 2 the resistance variable layer 3 having the spinel structure which is expressed as the chemical formula of (M'$_x$Fe$_{1-x}$)Fe$_2$O$_4$. Then, the upper electrode 4 (thickness: 0.2 μm, for example) is formed on the resistance variable layer 3 by the sputtering or the like, obtaining a resistance variable element 10.

The sizes and shapes of the lower electrode 2, the upper electrode 4, and the resistance variable layer 3 are controllable using a mask and lithography.

The resistivity (or the value of X) of the resistance variable layer 3 is easily controllable by controlling the voltages applied to the respective targets. A substrate temperature may be set to 300° C.

[Operation]

As shown in FIG. 1, during use of the resistance variable element 10, the lower electrode 2 and the upper electrode 4 are respectively electrically connected to different terminals of an electric power supply 5 (voltage pulse application device). The electric power supply 5 is an electric power supply serving to drive the resistance variable element 10. The electric power supply 5 is configured to be capable of applying an electric pulse (voltage pulse) having a predetermined voltage and a predetermined time width between the lower electrode 2 and the upper electrode 4. Hereinbelow, the voltage of the voltage pulse is defined by the electric potential of the upper electrode 4 based on the lower electrode 2 as a reference.

In response to the electric pulse applied by the electric power supply 5, the resistance value (electric resistance) of the resistance variable layer 3 increases or decreases. Hereinbelow, the state where the resistance value of the resistance variable layer 3 is a predetermined high value is referred to as that the resistance variable element 10 is in a high-resistance state, while the state where the resistance value of the resistance variable layer 3 is a predetermined value which is lower than the value corresponding to the high-resistance state is referred to as that the resistance variable element 10 is in a low-resistance state.

For example, when a voltage pulse (first voltage pulse having a first voltage) of a voltage which is not smaller (larger in absolute value of voltage) than a first threshold voltage (plus voltage) is applied, the resistance value of the resistance variable layer 2 decreases. On the other hand, when a voltage pulse which is smaller (smaller in absolute value) than the first threshold voltage is applied, the resistance value of the resistance variable layer 2 does not change.

When a voltage pulse (second voltage pulse having a second voltage) of a voltage which is not larger (larger in absolute value of voltage) than a second threshold voltage (minus voltage) is applied, the resistance value of the resistance variable layer 2 increases. On the other hand, when a voltage pulse which is larger (smaller in absolute value) than the second threshold voltage (minus voltage) is applied, the resistance value of the resistance variable layer 2 does not change.

As should be understood from above, the resistance variable element of this embodiment may be bipolar-drivable. For the resistance variable element 10 of this embodiment, for example, the magnitude (voltage) of the voltage pulse may be set to ±2V and the pulse width may be set to 100 ns (The same may occur in writing from the high-resistance state to the low-resistance state and writing from the low-resistance state to the high-resistance state).

In this embodiment, it is supposed that the high-resistance state corresponds to "0," the low-resistance state corresponds to "1," and the resistance variable element 10 is in the high-resistance state ("0") as an initial state. How to allocate the values to the resistance states and how to define which of the resistance states as the initial state may be determined as desired.

Figure 2:
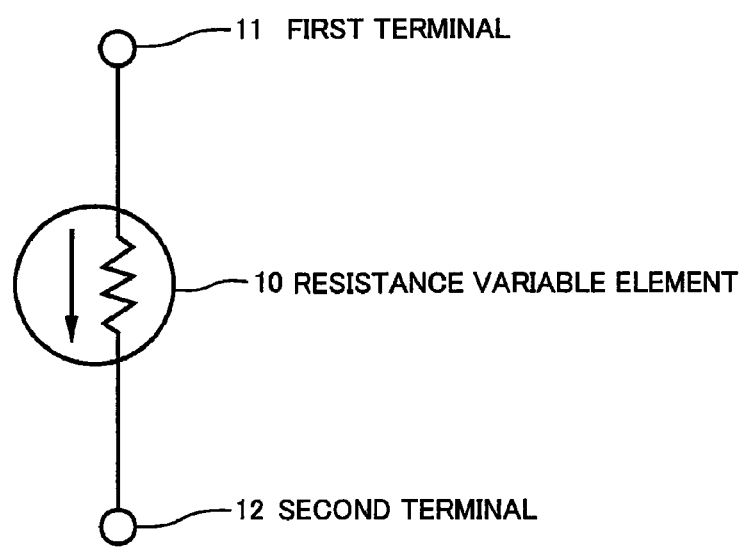
FIG. 2 is a view showing an example of a circuit for operating the resistance variable element according to Embodiment 1 of the present invention.

FIG. 2 is a view showing an example of a circuit for operating the resistance variable element according to Embodiment 1 of the present invention. Here it is supposed that the resistance variable element 10 is used as a memory and 1-bit data processing (writing and reading) is performed. The circuit in FIG. 2 includes the resistance variable element 10, a first terminal 11, and a second terminal 12. The upper electrode 4 of the resistance variable element 10 is electrically connected to the first terminal 11, while the lower electrode 2 thereof is electrically connected to the second terminal 12.

Figure 3:
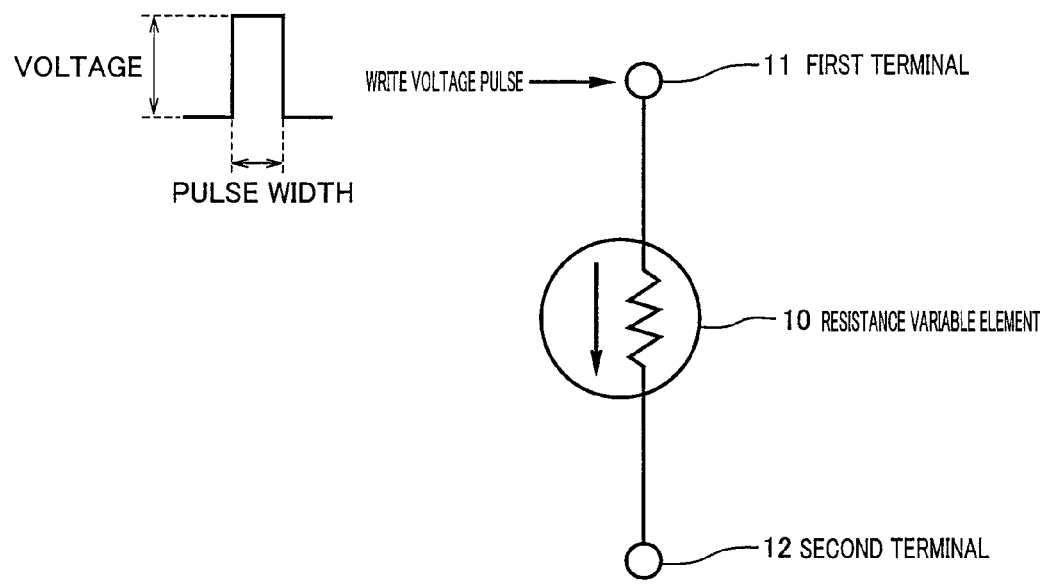
FIG. 3 is a view showing the operation in a case where data is written to the resistance variable element according to Embodiment 1 of the present invention.
Figure 4:
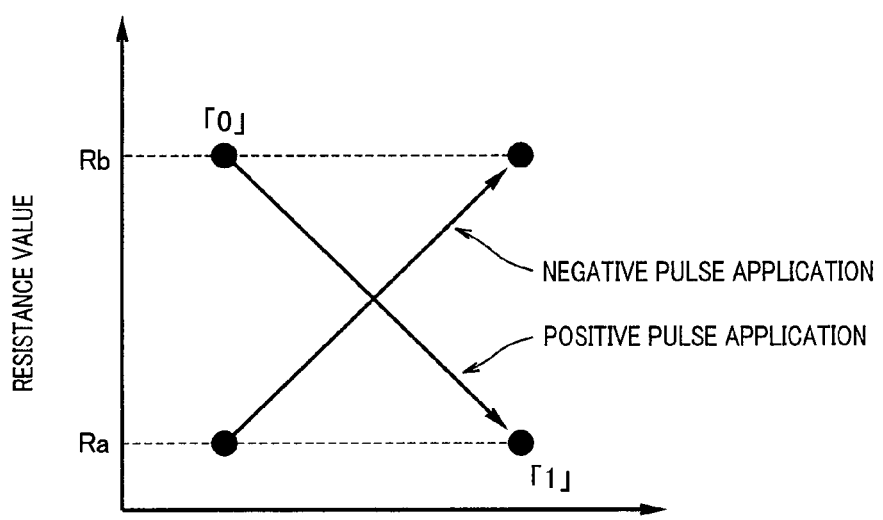
FIG. 4 is a view showing a change in a resistance value which occurs when data is written to the resistance variable element according to Embodiment 1 of the present invention.

FIG. 3 is a view showing the operation in a case where data is written to the resistance variable element according to Embodiment 1 of the present invention. FIG. 4 is a view showing a change in the resistance value which occurs when data is written to the resistance variable element according to Embodiment 1 of the present invention. As shown in FIG. 3, in writing, the second terminal 12 is electrically grounded (GND) and a voltage pulse is applied to the first terminal 11. The voltage pulse is defined based on the lower electrode 2 and a ground point as a reference.

Upon the first terminal 11 being applied with a write voltage pulse (hereinafter referred to as a positive pulse: first voltage pulse) which is not smaller than the first threshold voltage (e.g., +1V) and is pulse (positive), the resistance value of the resistance variable element 10 decreases from Rb corresponding to a high-resistance state to Ra corresponding to a low-resistance state as shown in FIG. 4. On the other hand, upon the first terminal 11 being applied with a write voltage pulse (hereinafter referred to as a negative pulse: second voltage pulse) which is not larger than the second threshold voltage (e.g., −1V) and is minus (negative), the resistance value of the resistance variable element 10 increases from Ra corresponding to the low-resistance state to Rb corresponding to the high-resistance state as shown in FIG. 4. That is, when the voltage pulse is applied to cause a current to flow in a direction indicated by an arrow of FIG. 3, the resistance value of the resistance variable element decreases, while when the voltage pulse is applied to cause a current to flow in a direction opposite to the direction indicated by the arrow, the resistance value of the resistance variable element increases.

In a case where 1-bit data indicating "1" is written to (stored in) the resistance variable element 10, the resistance variable element 10 changes to the low-resistance state (including a case where the element 10 maintains the low-resistance state which is a current state and does not change). Such an operation is referred to as "writing for attaining the low-resistance state." In writing for attaining the "low-resistance state," the second terminal 12 of FIG. 3 is electrically grounded and the positive pulse for writing is applied to the first terminal 11 of FIG. 3. The voltage value of the positive pulse is set to, for example, +2V, and the pulse width of the positive pulse is set to, for example, 100 ns. According to the operation, the positive pulse is applied to the resistance variable element 10, and the resistance value of the resistance variable element 10 becomes Ra corresponding to the low-resistance state. That is, the resistance value Rb before application of the voltage pulse changes to Ra, whereas the resistance value Ra before application of the voltage pulse maintains Ra and does not change. With the method described above, the writing for attaining the low-resistance state of the resistance variable element 10 is performed.

In a case where 1-bit data indicating "0" is written to (stored in) the resistance variable element 10, the resistance variable element 10 changes to the high-resistance state (including a case where the element 10 maintains the high-resistance state which is a current state and does not change). Such an operation is referred to as "writing for attaining the high-resistance state." In writing for attaining the "high-resistance state," the second terminal 12 of FIG. 3 is electrically grounded and a negative pulse for writing is applied to the first terminal 11 of FIG. 3. The voltage value of the negative pulse is set to, for example, −2V, and the pulse width of the negative pulse is set to, for example, 100 ns. According to the operation, the negative pulse is applied to the resistance variable element 10, and the resistance value of the resistance variable element 10 becomes Rb corresponding to the high-resistance state. That is, the resistance value Rb before application of the voltage pulse maintains Rb and does not change, whereas the resistance value Ra before application of the voltage pulse changes to Rb. With the method described above, the writing for attaining the high-resistance state of the resistance variable element 10 is performed.

Figure 5:
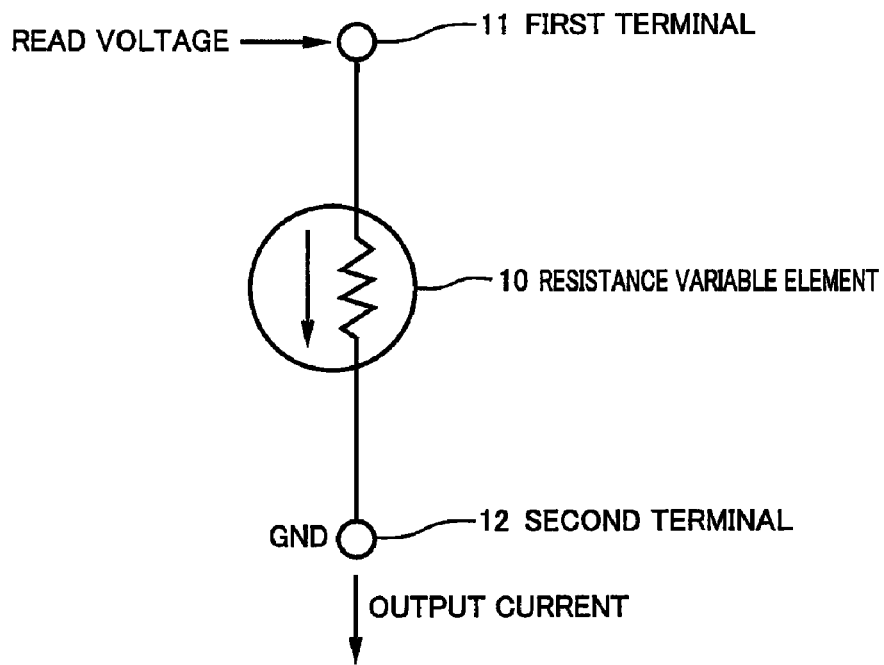
FIG. 5 is a view showing the operation in a case where data written in the resistance variable element according to Embodiment 1 of the present invention is read.
Figure 6:
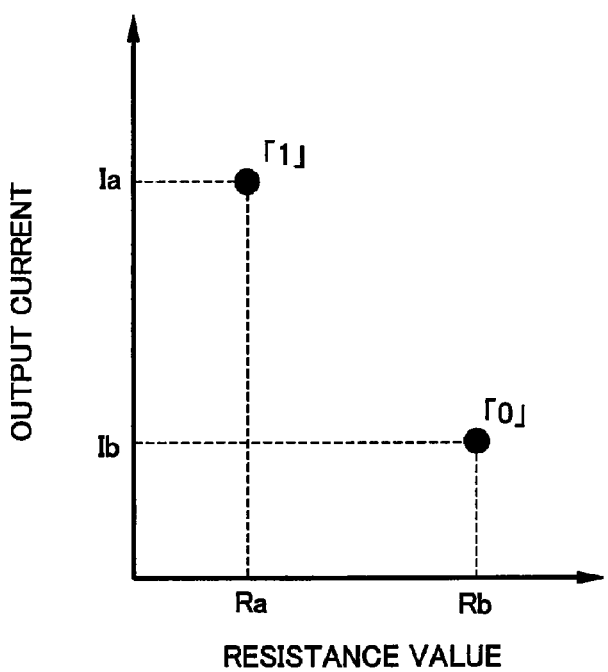
FIG. 6 is a view showing the relationship between a current flowing in a circuit and the resistance value of the resistance variable element, in reading of data, in the resistance variable element according to Embodiment 1 of the present invention.

FIG. 5 is a view showing the operation in a case where data written in the resistance variable element according to Embodiment 1 of the present invention is read. FIG. 6 is a view showing the relationship between a current flowing in a circuit and the resistance value of the resistance variable element, in reading of the data, in the resistance variable element according to Embodiment 1 of the present invention. As shown in FIG. 5, in writing of data, the second terminal 12 is electrically grounded (GND), and a read voltage is applied to the first terminal 11. The read voltage is defined based on the lower electrode 2 and the ground point as a reference.

Upon the first terminal 11 being applied with a read voltage which is smaller than the first threshold voltage and is pulse (positive) or is larger than the second threshold voltage and is minus (negative), a current according to the resistance value of the resistance variable element 10 flows. To be specific, as shown in FIG. 6, the output current value is Ia when the resistance value of the resistance variable element 10 is Ra corresponding to the low-resistance state, while the output current value is Ib when the resistance value of the resistance variable element 10 is Rb corresponding to the high-resistance state.

In a case where the resistance state is read from the resistance variable element 10, the second terminal 12 of FIG. 5 is electrically grounded, and a read voltage is applied to the first terminal 11 of FIG. 5. The read voltage is set to, for example, +0.5V. Upon the read voltage being applied to the resistance variable element 10, a current flowing in the circuit is caused to have a current value according to the resistance value of the resistance variable element. By detecting the current value of the current flowing between the first terminal 11 and the second terminal 12, the resistance value of the resistance variable element 10 is obtained. To be specific, when the current value is Ia, the resistance value of the resistance variable element 10 is Ra corresponding to the low-resistance state, and therefore, data written in the resistance variable element 10 is found to be "1." And, when the current value is Ib, the resistance value of the resistance variable element 10 is Rb corresponding to the high-resistance state, and therefore, data written in the resistance variable element 10 is found to be "0." With the above described method, data written in the resistance variable element 10 is read.

The resistance variable element 10 of this embodiment has nonvolatility in which the resistance value does not change even when the electric power supply is turned off.

[Effect]

The resistance variable element 10 of this embodiment is capable of writing (writing for attaining the high-resistance state or the low-resistance state) using a short voltage pulse having a pulse width of 100 ns. The resistance variable element 10 can be manufactured at a low temperature of about 300° C., and therefore is highly compatible with the conventional semiconductor manufacture process (400° C. to 500° C.). In addition, the resistance variable element 10 can dispense with the "forming," and can have sufficiently long data retention characteristic.

According to the resistance variable element 10 of this embodiment, it is possible to provide a resistance variable element and resistance variable memory apparatus which are manufactured at a low temperature, dispense with the "forming," have a high write speed (especially write speed at which the element 10 is changed to the high-resistance state), and have high stability.

Furthermore, since the resistance variable element 10 of this embodiment conducts a current with a small magnitude in the application of the voltage pulse, it is highly probable that the resistance variable element 10 can achieve electric power saving when the resistance variable element is miniaturized to provide a memory apparatus having a large capacity.

[Modification]

The first threshold voltage, the second threshold voltage, the voltage and pulse width of the positive pulse, the voltage and pulse width of the negative pulse, and the value of the read voltage are not limited to the above identified values. Any other values may be used so long as they are compatible with the resistance variable elements actually manufactured.

Other layer may be sandwiched between the lower electrode 2 and the resistance variable layer 3 and between the resistance variable layer 3 and the upper electrode 4, so long as the lower electrode 2 is electrically connected to the resistance variable layer 3 and the resistance variable layer 3 is electrically connected to the upper electrode 4.

Having described above an example in which the M'Fe$_2$O$_4$ target material and the Fe$_3$O$_4$ target material are caused to perform electric discharge simultaneously by the sputtering conducted in such a way that the electric powers applied to the respective targets are controlled, thereby changing the value of X of the chemical formula of (M'$_x$Fe$_{1-x}$) Fe$_2$O$_4$, the method of controlling the component of the resistance variable layer is not limited to this. For example, by conducting the sputtering using a target which is a mixture of M'Fe$_2$O$_4$ and Fe$_3$O$_4$ which are mixed in a specified ratio, the value of X of the chemical formula of (M'$_x$Fe$_{1-x}$) Fe$_2$O$_4$ can be changed.

EXAMPLE

Example 1

The lower electrode (size: 20 μm×20 μm) made of Pt was formed on the silicon substrate to have a thickness of 0.2 μm by the sputtering. NiFe$_2$O$_4$ target and Fe$_3$O$_4$ target were prepared. The respective targets were caused to perform electric discharge simultaneously by the sputtering, forming on the lower electrode the resistance variable layer (size: 10 μm×10 μm: area 100 μm$^2$) having the spinel structure which is expressed as the chemical formula of (Ni$_x$Fe$_{1-x}$) Fe$_2$O$_4$ using the mask and the lithography. The substrate temperature was set to 300° C. during formation of the resistance variable layer. The size of a portion where the lower electrode and the resistance variable layer contact each other was (2 μm×2 μm: area 4 μm$^2$). The thickness of the resistance variable layer was set to 100 nm. Then, the upper electrode (size: 2 μm×2 μm) made of Pt was formed on the resistance variable layer to have a thickness of 0.2 μm by the sputtering using the mask and the lithography, thereby obtaining the resistance variable element. The size of a portion where the upper electrode and the resistance variable layer contact each other was (2 μm×2 μm: area 4 μm$^2$).

In Example 1, the voltages applied to the respective targets were controlled so that the value of X of (Ni$_x$Fe$_{1-x}$) Fe$_2$O$_4$ forming the resistance variable layer was 0.35. The value of X was verified using a combination of RBS (Rutherford Back Scattering) method and X-ray fluorescence analysis method. As a result of the verification, the value of X was 0.35. The resistivity was measured using four-terminal four-probe method. The resistivity of the resistance variable layer of Example 1 was 0.5 Ωcm.

The resistance variable element obtained with the above method was connected to the electric power supply, and two kinds of voltage pulses (voltage: +2V and −2V, pulse width: 100 ns) were alternately applied. The voltage with which the electric potential of the upper electrode with respect to the lower electrode is high was plus.

Every time the voltage pulse was applied, the resistance value of the resistance variable element was measured. In measurement, the voltage of +0.5V was applied for about seconds. The resistance value of the resistance variable element did not change with such a voltage. The resistance value of the resistance variable element was calculated from the applied voltage (+0.5V) and the current flowing therein.

It was confirmed that the resistance variable element of this example has nonvolatility in which the resistance value does not change even when the electric power supply is turned off. The magnitude of the current flowing when applying the voltage pulse was measured and was 1 mA or smaller. Therefore, it is highly probable that the resistance variable element of this example can achieve electric power saving when the resistance variable element is miniaturized to provide a memory apparatus having a large capacity.

Figure 7:
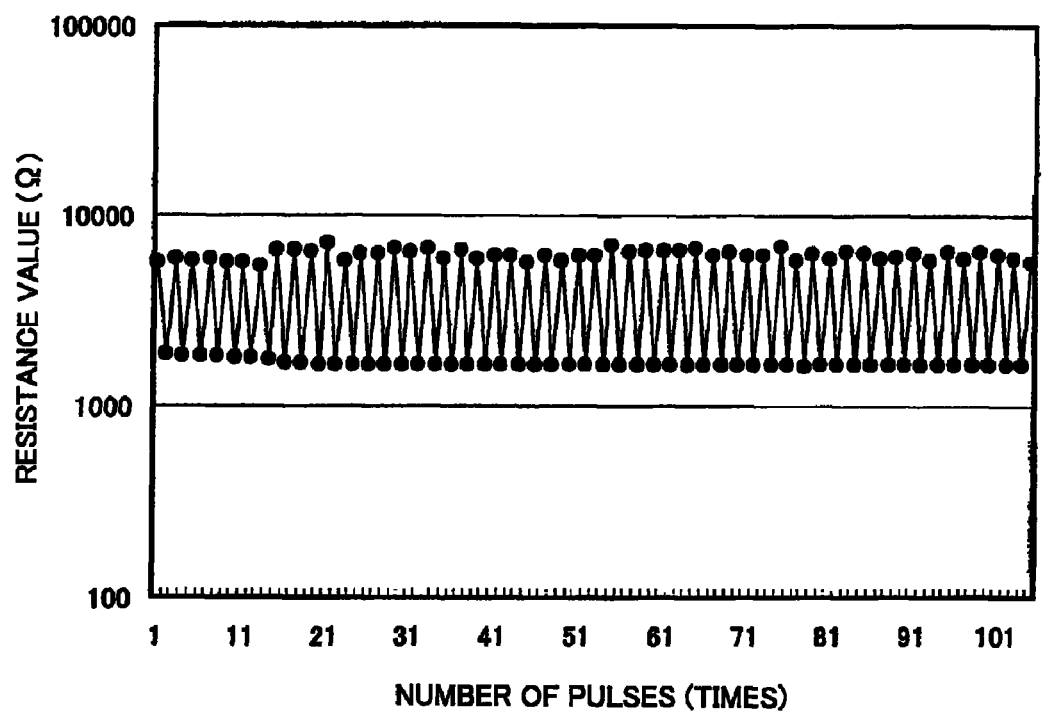
FIG. 7 is a view showing a change in the resistance value which occurs when voltage pulses are applied to a resistance variable element of Example 1.

FIG. 7 is a view showing a change in the resistance value which occurs when voltage pulses are applied to the resistance variable element of Example 1. As shown in FIG. 7, the resistance variable element changed from a high-resistance state (about 5600Ω) to a low-resistance state (about 1800Ω) by first pulse application (application of the positive pulse). The resistance variable element returned from the low-resistance state to the high-resistance state by second pulse application (application of the negative pulse). Thereafter, by application of the two kinds of voltage pulses (positive pulse and negative pulse), the resistance variable element stably transitioned between the low-resistance state and the high-resistance state periodically. That is, the resistance variable element obtained in Example 1 had favorable memory characteristics from the first pulse application. Therefore, it was found that the resistance variable element of Example 1 can dispense with the "forming" and the resistance variable element obtained by producing the layers can be used as the memory as it is.

Even when the positive pulse was applied to the resistance variable element of Example 1 in the low-resistance state, the resistance value did not substantially change and the resistance variable element maintained the low-resistance state. On the other hand, even when the negative pulse was applied to the resistance variable element in the high-resistance state, the resistance value did not substantially change and the resistance variable element maintained the high-resistance state. From the above results, it was found that the resistance variable element of Example 1 is overwritable.

Example 2

In example 2, the resistance variable element was formed with the method similar to that of Example 1, except that different parameters were used, and writing and reading were performed.

In Example 2, the voltages applied to the respective targets were controlled so that the value of X of (Ni$_x$Fe$_{1-x}$) Fe$_2$O$_4$ forming the resistance variable layer was 0.65. The value of X was verified using a combination of the RBS (Rutherford Back Scattering) method and the X-ray fluorescence analysis method. As a result of the verification, the value of X was 0.65. The resistivity was measured using the four-terminal four-probe method. The resistivity of the resistance variable layer of Example 2 was 10 Ωcm.

It was confirmed that the resistance variable element of this example has nonvolatility in which the resistance value does not change even when the electric power supply is turned off. The magnitude of the current flowing when applying the voltage pulse was measured and was 1 mA or smaller. Therefore, it is highly probable that the resistance variable element of this example can achieve electric power saving when the resistance variable element is miniaturized to provide a memory apparatus having a large capacity.

Figure 8:
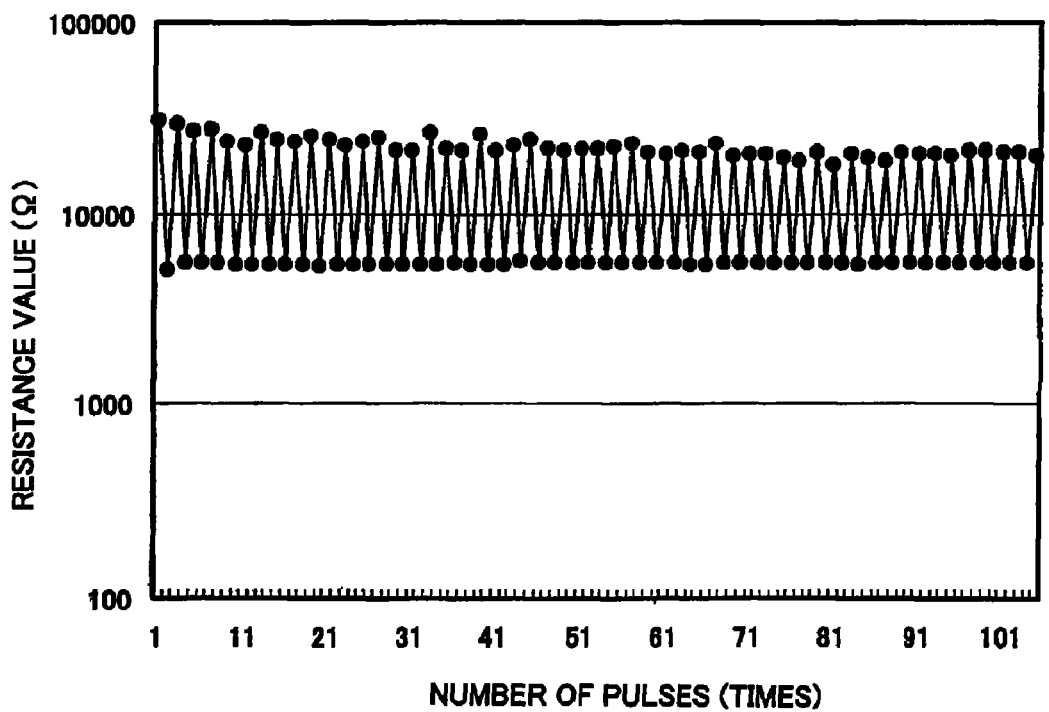
FIG. 8 is a view showing a change in the resistance value which occurs when voltage pulses are applied to a resistance variable element of Example 2.

FIG. 8 is a view showing a change in the resistance value which occurs when voltage pulses are applied to the resistance variable element of Example 2. As shown in FIG. 8, the resistance variable element changed from a high-resistance state (about 30000Ω) to a low-resistance state (about 5000Ω) by first pulse application (application of the positive pulse). The resistance variable element returned from the low-resistance state to the high-resistance state by second pulse application (application of the negative pulse). Thereafter, by application of the two kinds of voltage pulses (positive pulse and negative pulse), the resistance variable element stably transitioned between the low-resistance state and the high-resistance state periodically. That is, the resistance variable element of Example 2 had favorable memory characteristics from the first pulse application. Therefore, it was found that the resistance variable element obtained in Example 2 can dispense with the "forming" and the resistance variable element obtained by producing the layers can be used as the memory as it is.

Even when the positive pulse was applied to the resistance variable element of Example 2 in the low-resistance state, the resistance value did not substantially change and the resistance variable element maintained the low-resistance state. On the other hand, even when the negative pulse was applied to the resistance variable element in the high-resistance state, the resistance value did not substantially change and the resistance variable element maintained the high-resistance state. From the above results, it was revealed that the resistance variable element of Example 1 is overwritable.

Example 3

In example 3, the resistance variable element was formed with the method similar to that of Example 1, except that different parameters were used, and writing and reading were performed.

In Example 3, the voltages applied to the respective targets were controlled so that the value of X of $(Ni_xFe_{1-x})Fe_2O_4$ forming the resistance variable layer was 0.90. The value of X was verified using a combination of the RBS (Rutherford Back Scattering) method and the X-ray fluorescence analysis method. As a result of the verification, the value of X was 0.90. The resistivity was measured using the four-terminal four-probe method. The resistivity of the resistance variable layer of Example 3 was 100 Ωcm.

It was confirmed that the resistance variable element of this example has nonvolatility in which the resistance value does not change even when the electric power supply is turned off. The magnitude of the current flowing when applying the voltage pulse was measured and was 1 mA or smaller. Therefore, it is highly probable that the resistance variable element of this example can achieve electric power saving when the memory element is miniaturized to provide a memory apparatus having a large capacity.

Figure 9:
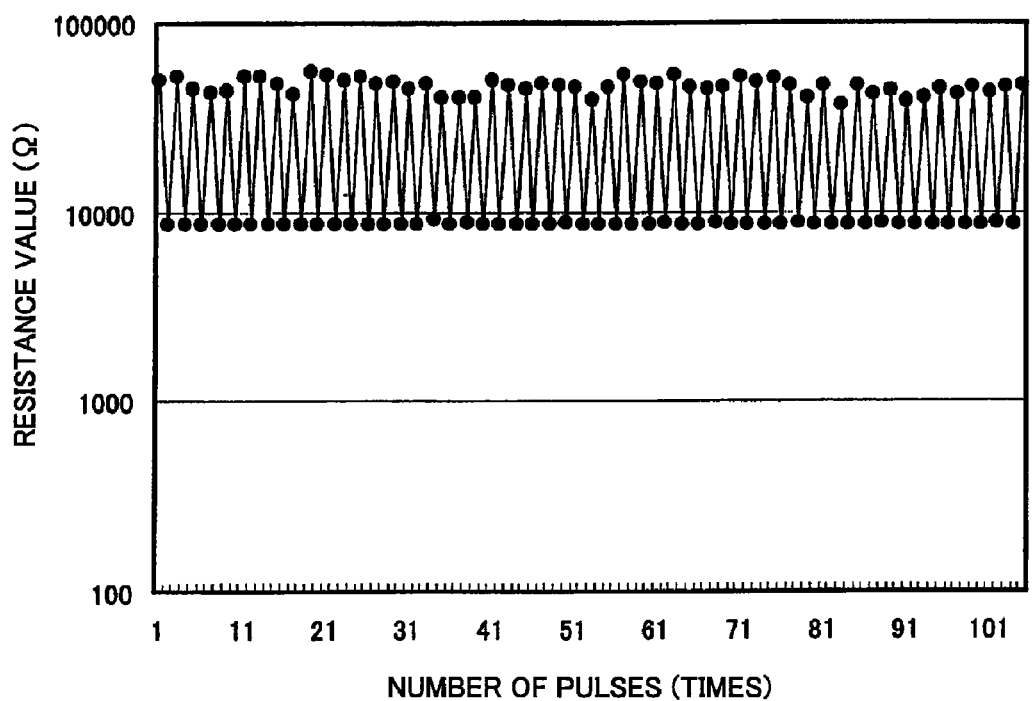
FIG. 9 is a view showing a change in the resistance value which occurs when voltage pulses are applied to a resistance variable element of Example 3.

FIG. 9 is a view showing a change in the resistance value which occurs when voltage pulses are applied to the resistance variable element of Example 3. As shown in FIG. 9, the resistance variable element changed from a high-resistance state (about 50000Ω) to a low-resistance state (about 8500Ω) by first pulse application (application of the positive pulse). The resistance variable element returned from the low-resistance state to the high-resistance state by second pulse application (application of the negative pulse). Thereafter, by application of the two kinds of voltage pulses (positive pulse and negative pulse), the resistance variable element stably transitioned between the low-resistance state and the high-resistance state periodically. That is, the resistance variable element obtained in Example 3 had favorable memory characteristics from the first pulse application. Therefore, it was found that the resistance variable element of Example 3 can dispense with the "forming" and the resistance variable element obtained by producing the layers can be used as the memory as it is.

Even when the positive pulse was applied to the resistance variable element of Example 3 in the low-resistance state, the resistance value did not substantially change and the resistance variable element maintained the low-resistance state. On the other hand, even when the negative pulse was applied to the resistance variable element in the high-resistance state, the resistance value did not substantially change and the resistance variable element maintained the high-resistance state. From the above results, it was revealed that the resistance variable element of Example 1 is overwritable.

Example 4

In Example 4, endurance characteristic (stability of the operation) was verified using the resistance variable element with X=0.90 which was obtained in Example 3.

Figure 10:
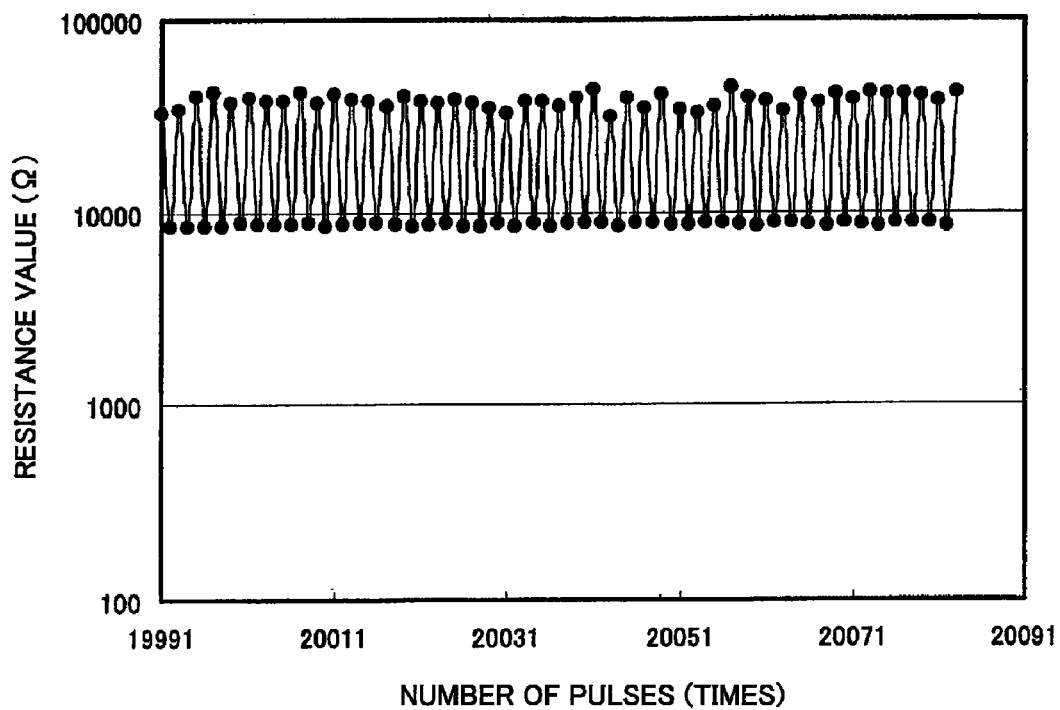
FIG. 10 is a view showing a change in the resistance value which occurs when a write operation (voltage pulse: +2V, 100 ns) for attaining a low-resistance state and a write operation (voltage pulse: −2V, 100 ns) for attaining a high-resistance state are repeated about twenty thousands times for the resistance variable element obtained in Example 3.

FIG. 10 is a view showing a change in the resistance value which occurs when a write operation (voltage pulse: +2V, 100 ns) for attaining the low-resistance state and a write operation (voltage pulse: −2V, 100 ns) for attaining the high-resistance state are repeated about twenty thousands times for the resistance variable element obtained in Example 3. As can be seen from FIG. 10, it was found that the resistance variable element stably transitioned between the low-resistance state and the high-resistance state periodically, even when writing was repeated twenty thousands times or more. It was also found that the resistance value corresponding to the low-resistance state did not substantially change and the resistance value corresponding to the high-resistance state did not substantially change, from the start (FIG. 9) to the end (FIG. 10) of the experiment. Therefore, it was revealed that the resistance variable element obtained in Example 3 had favorable endurance characteristic.

Example 5

The lower electrode (size: 20 μm×20 μm) made of Pt was formed on the silicon substrate to have a thickness of 0.2 μm by the sputtering. $ZnFe_2O_4$ target and $Fe_3O_4$ target were prepared. The respective targets were caused to perform electric discharge simultaneously by the sputtering, forming on the lower electrode the resistance variable layer (size: 10 μm×10 μm) having the spinel structure which is expressed as the chemical formula of $(Zn_xFe_{1-x})Fe_2O_4$. The thickness of the resistance variable layer was set to 100 nm. Then, the upper electrode (size: 2 μm×2 μm) made of Pt was formed on the resistance variable layer to have a thickness of 0.2 μm by the sputtering, thereby obtaining the resistance variable element.

In Example 5, the voltages applied to the respective targets were controlled so that the value of X of $(Zn_xFe_{1-x})Fe_2O_4$ forming the resistance variable layer was 0.50. The value of X was verified using a combination of the RBS (Rutherford Back Scattering) method and the X-ray fluorescence analysis method. As a result of the verification, the value of X was 0.50. The resistivity was measured using the four-terminal four-probe method. The resistivity of the resistance variable layer of Example 5 was 3 Ωcm.

The resistance variable element obtained with the above method was connected to the electric power supply, and two kinds of voltage pulses (voltage: +5V and −5V, pulse width: 200 ns) were alternately applied. The voltage with which the electric potential of the upper electrode with respect to the lower electrode is high was plus.

Every time the voltage pulse was applied, the resistance value of the resistance variable element was measured. In measurement, the voltage of +0.5V was applied for about seconds. The resistance value of the resistance variable element did not change with such a voltage. The resistance value of the resistance variable element was calculated from the applied voltage (+0.5V) and the current flowing therein.

It was confirmed that the resistance variable element of this example has nonvolatility in which the resistance value does not change even when the electric power supply is turned off. The magnitude of the current flowing when applying the voltage pulse was measured and was 1 mA or smaller. Therefore, it is highly probable that the resistance variable element of this example can achieve electric power saving when the resistance variable element is miniaturized to provide a memory apparatus having a large capacity.

Figure 11:
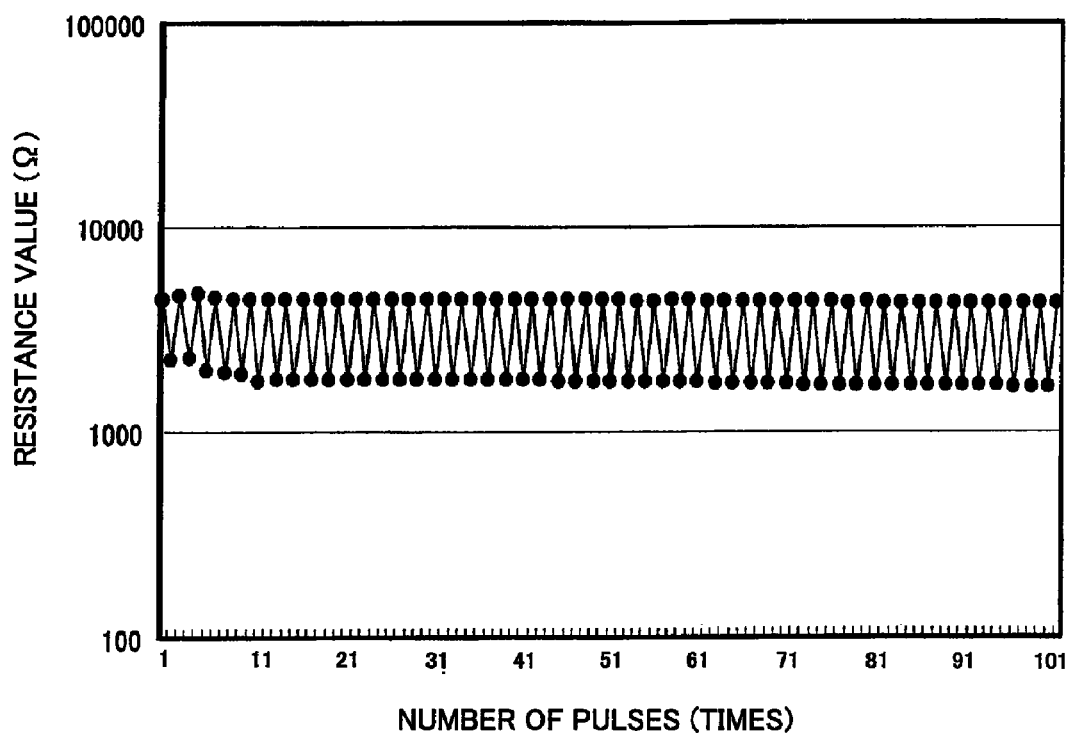
FIG. 11 is a view showing a change in the resistance value which occurs when voltage pulses are applied to a resistance variable element of Example 5.

FIG. 11 is a view showing a change in the resistance value which occurs when voltage pulses are applied to the resistance variable element of Example 5. As shown in FIG. 11, the resistance variable element changed from the high-resistance state (about 4500Ω) to the low-resistance state (about 2000Ω) by first pulse application (application of the positive pulse). The resistance variable element returned from the low-resistance state to the high-resistance state by second pulse application (application of the negative pulse). Thereafter, by application of the two kinds of voltage pulses (positive pulse and negative pulse), the resistance variable element stably transitioned between the low-resistance state and the high-resistance state periodically. That is, the resistance variable element obtained in Example 5 had favorable memory characteristics from the first pulse application. Therefore, it was found that the resistance variable element of Example 5 can dispense with the "forming" and the resistance variable element obtained by producing the layers can be used as the memory as it is.

Even when the positive pulse was applied to the resistance variable element of Example 5 in the low-resistance state, the resistance value did not substantially change and the resistance variable element maintained the low-resistance state. On the other hand, even when the negative pulse was applied to the resistance variable element in the high-resistance state, the resistance value did not substantially change and the resistance variable element maintained the high-resistance state. From the above results, it was revealed that the resistance variable element of Example 1 is overwritable.

Comparative Example 1

In Comparative example 1, the resistance variable element was formed with the method similar to that of Example 1, except that different parameters were used, and writing and reading were performed.

In Comparative example 1, the voltages applied to the respective targets were controlled so that the value of X of $(Ni_xFe_{1-x})Fe_2O_4$ forming the resistance variable layer was 0.30. The value of X was verified using a combination of the RBS (Rutherford Back Scattering) method and the X-ray fluorescence analysis method. As a result of the verification, the value of X was 0.30. The resistivity was measured using the four-terminal four-probe method. The resistivity of the resistance variable layer of Comparative Example 1 was 0.3 Ωcm.

Figure 12:
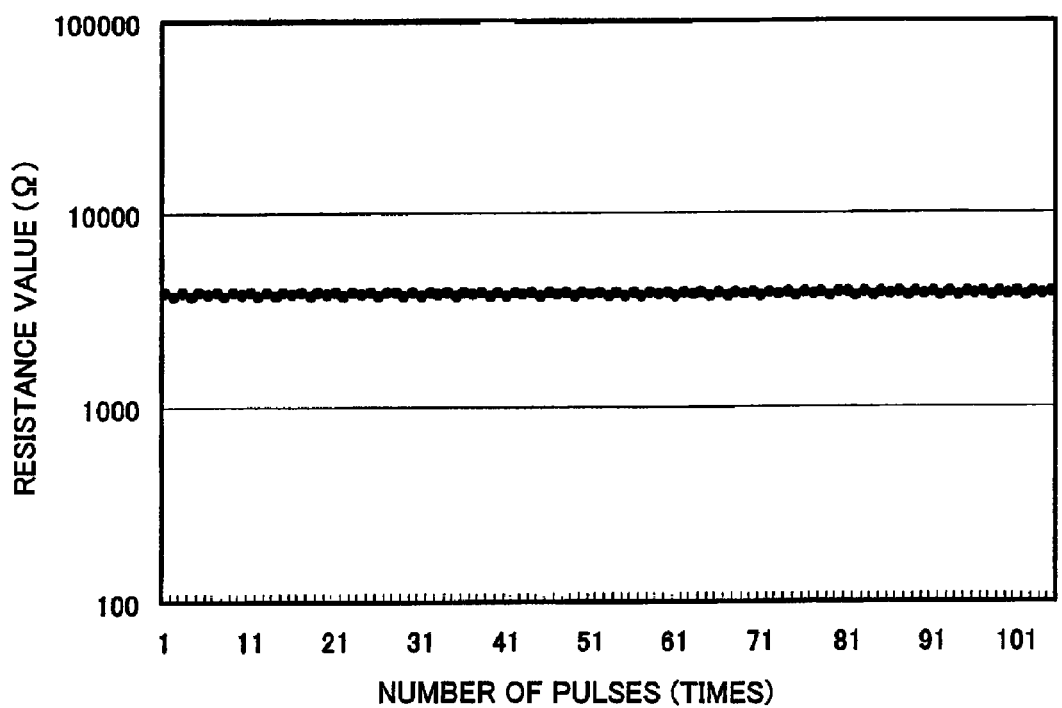
FIG. 12 is a view showing a change in the resistance value which occurs when voltage pulses are applied to a resistance variable element of Comparative example 1.
Figure 13:
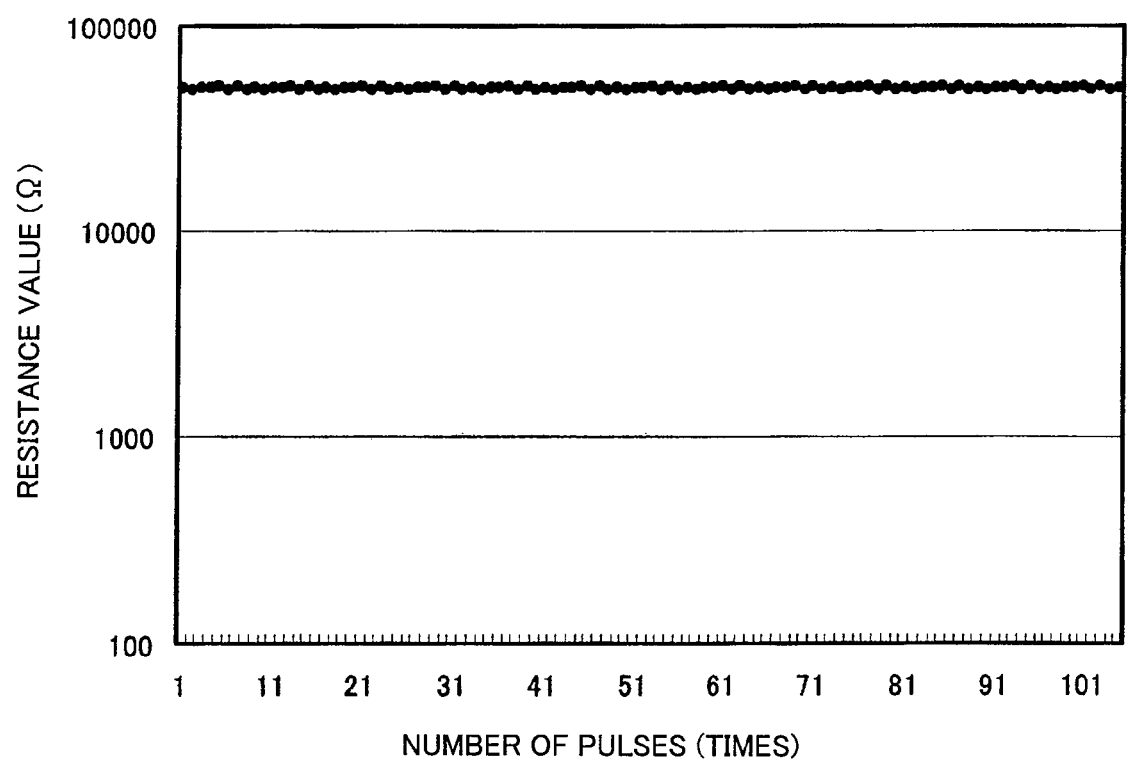
FIG. 13 is a view showing a change in the resistance value which occurs when voltage pulses are applied to a resistance variable element of Comparative example 2.

FIG. 12 is a view showing a change in the resistance value which occurs when voltage pulses were applied to the resistance variable element of Comparative example 1. As shown in FIG. 12, with X=0.30, the resistance variable element did not substantially change the resistance value even though the voltage pulses were applied and did not show the memory characteristics.

Comparative Example 2

In Comparative example 2, the resistance variable element was formed with the method similar to that of Example 1, except that different parameters were used, and writing and reading were performed.

In Comparative example 2, the voltages applied to the respective targets were controlled so that the value of X of $(Ni_xFe_{1-x})Fe_2O_4$ forming the resistance variable layer was 0.95. The value of X was verified using a combination of the RBS (Rutherford Back Scattering) method and the X-ray fluorescence analysis method. As a result of the verification, the value of X was 0.95. The resistivity was measured using the four-terminal four-probe method. The resistivity of the resistance variable layer of Comparative example 2 was 150 Ωcm.

FIG. 12 is a view showing a change in the resistance value which occurs when voltage pulses were applied to the resistance variable element of Comparative example 3. As shown in the Figure, with X=0.90, the resistance variable element did not substantially change the resistance value even though the voltage pulses were applied, and did not show the memory characteristics.

Comparative Example 3

The lower electrode (size: 20 μm×20 μm) made of Pt was formed on the silicon substrate to have a thickness of 0.2 μm by the sputtering. $Fe_3O_4$ target was prepared. By the sputtering, on the lower electrode, the resistance variable layer (size: 10 μm×10 μm) having the spinel structure which is expressed as the chemical formula of $Fe_3O_4$ was formed. The thickness of the resistance variable layer was set to 100 nm. Then, the upper electrode (size: 2 μm×2 μm) made of Pt was formed on the resistance variable layer to have a thickness of 0.2 μm by the sputtering, thereby obtaining the resistance variable element. The resistivity was measured by the four-terminal four-probe method. The resistivity of the resistance variable layer of Comparative example 3 was 0.01 Ωcm.

The resistance variable element obtained with the above method was connected to the electric power supply, and two kinds of voltage pulses (voltage: +3V and −3V, pulse width: 100 ns) were selectively applied. The voltage with which the electric potential of the upper electrode with respect to the lower electrode is high was plus.

Every time the voltage pulse was applied, the resistance value of the resistance variable element was measured. In measurement, the voltage of +0.5V was applied for about seconds. The resistance value of the resistance variable element did not change with such a voltage. The resistance value of the resistance variable element was calculated from the applied voltage (+0.5V) and the current flowing therein.

Figure 14:
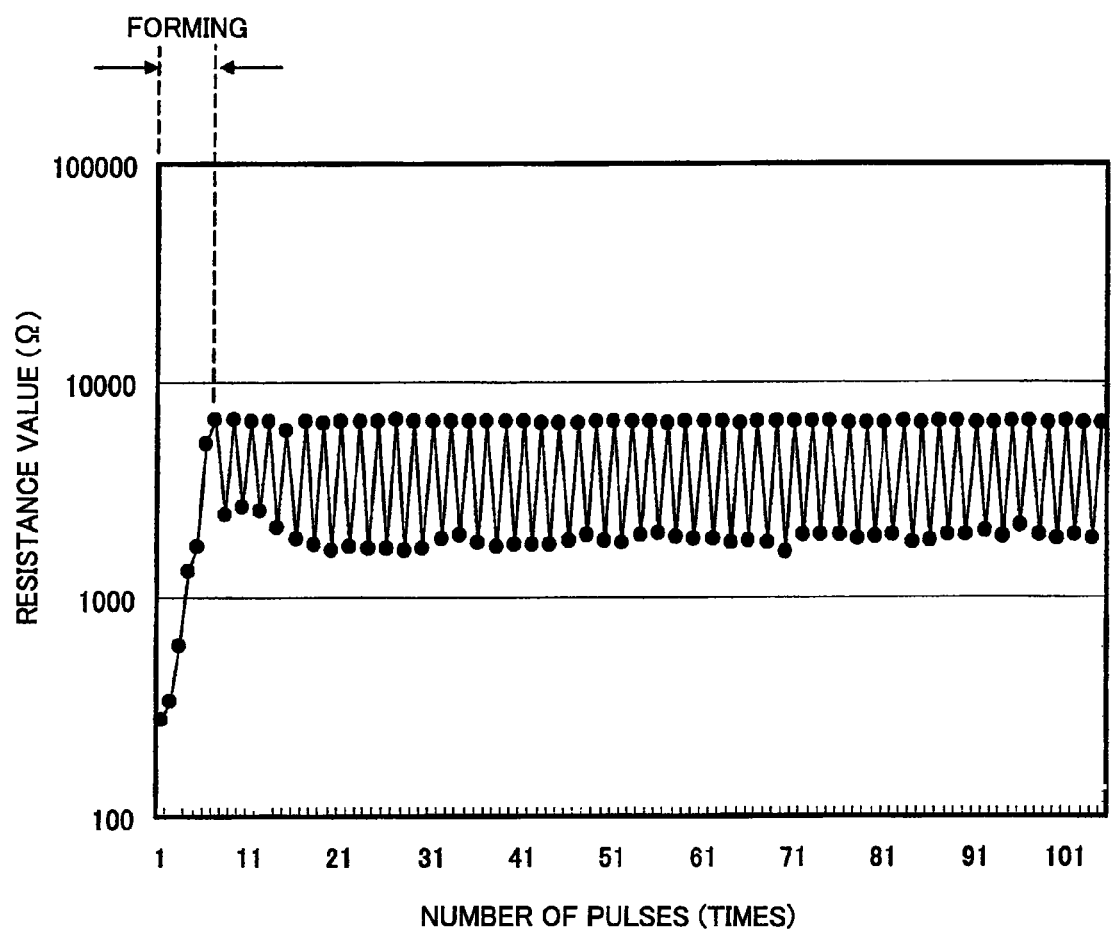
FIG. 14 is a view showing a change in the resistance value which occurs when voltage pulses are applied to a resistance variable element of Comparative example 3.

FIG. 14 is a view showing a change in the resistance value which occurs when voltage pulses are applied to the resistance variable element of Comparative example 3. As shown in FIG. 14, the resistance variable element according to Comparative example 3 had a low resistance value in an initial state and first showed the memory characteristics after applying a "forming" voltage pulse of −3V and 100 μs six times. That is, it was found that the "forming" is needed to enable the resistance variable element obtained in Comparative example 3 to show the memory characteristics.

Example 6

In Example 1 to Example 5, the resistance variable element has two resistance states. By allocating numeric values to the resistance values corresponding to the respective resistance states using such a characteristic, "1-bit" data can be written and read. Alternatively, multi-valued data (data capable of having three or more values) may be written and read in such a manner that three or more resistance states are set and the resistance variable element is caused to transition to each of the resistance states according to a value to be written.

Figure 15:
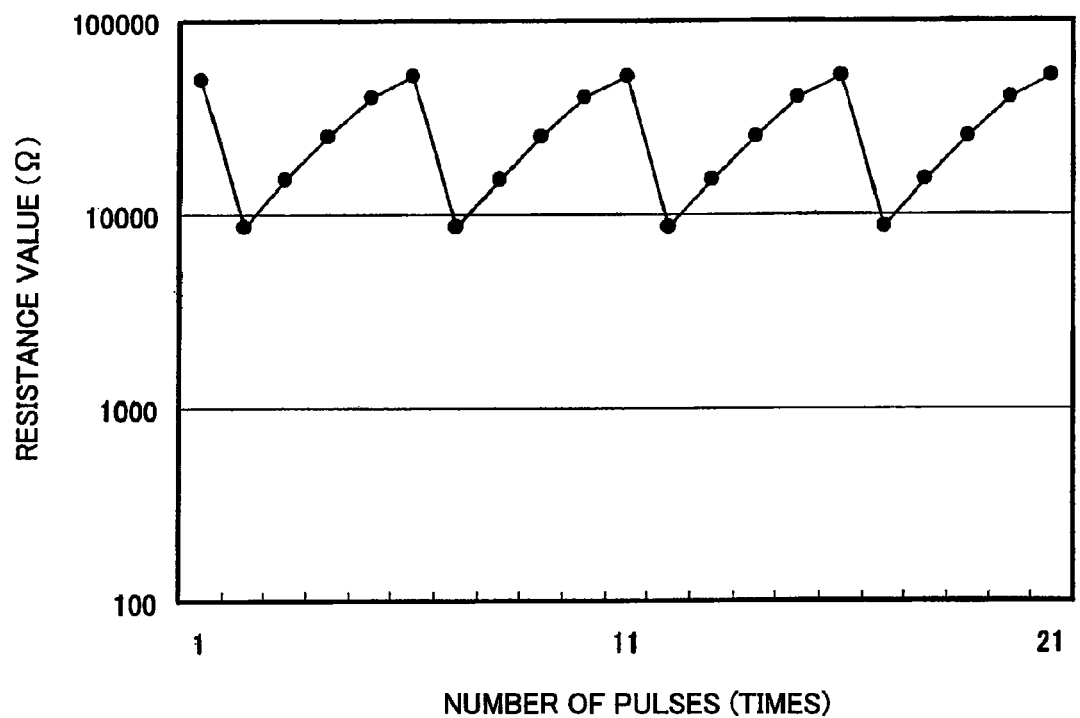
FIG. 15 is a view showing a change in the resistance value which occurs when voltage pulses are applied to a resistance variable element of Example 6.

FIG. 15 is a view showing a change in the resistance value which occurs when voltage pulses are applied to a resistance variable element of Example 6. In this example, the resistance variable element was formed (as in Example 3) using as the resistance variable layer a material having a spinel structure which is expressed as a chemical formula of $Ni_{0.9}Fe_{0.1}Fe_2O_4$. Upon application of a positive pulse of +3V and 100 ns to the resistance variable element, the resistance value of the resistance variable element changed from about 50000Ω to about 8600Ω as shown in FIG. 15 (The resistivity was measured by the four-terminal four-probe method). Subsequently, upon application of a negative pulse of −1V and 100 ns to the resistance variable element, the resistance value changed to 15000Ω with first application, to 25000Ω with second application, and to 40000Ω with third application, and returned to about 50000Ω with fourth application, as shown in FIG. 15. By repeating the same processing, the resistance variable element transitioned among five resistance states with high reproducibility.

From the above results, it was found that the resistance variable element of Example 6 is usable as a multi-valued memory. Alternatively, by controlling the voltage or the pulse width of the negative pulse, for example, the resistance variable element can be changed to have a desired resistance value by application of the voltage pulse only once. In this case, one kind of positive pulse is used but plural kinds of negative pulses are used.

[Consideration]

From Comparative example 3, it is found that the preprocessing called the "forming" is needed to enable the resistance variable element using $Fe_3O_4$ as the resistance variable layer to show the memory characteristic. In the "forming" process in Comparative example 3, the resistance value increases by applying the voltage pulse of −3V and 100 μs several times. From this fact, it is considered that the "forming" process is a process for changing (oxidizing) a part of $Fe_3O_4$ to $\gamma\text{-}Fe_2O_4$ or $\alpha\text{-}Fe_2O_4$ which is a higher-resistance phase.

It is considered that $Fe_3O_4$ itself changes the resistance in response to the pulse. It is considered that to enable the resistance variable element to show the memory characteristic, it is necessary to mix low-resistance $Fe_3O_4$ with a high-resistance material to provide a high-resistance value as a whole.

As is evident from Example 1 to Example 5, the resistance value increases by adding elements such as Ni or Zn to $Fe_3O_4$. The reason why the "forming" can be dispensed with in Example 1 to Example 5 may be due to the fact that the resistance value increases by adding transition metal such as Ni or Zn. It is presumed that the "forming" can be dispensed with by allowing elements other than Ni or Zn to partially replace Fe so long as they have the same structure as $Fe_3O_4$ (are capable of replacing Fe sites while maintaining a crystalline structure in $Fe_3O_4$ having the spinel structure) and increase electric resistances. Examples of such elements are Cu, Mn, and Co, in addition to Ni and Zn.

The resistance variable layer obtained in each example has a multi-crystalline structure rather than an amorphous structure. Therefore, it can be seen that the resistance variable element of this example is capable of maintaining reliability as a memory in a long-time use as compared to the conventional resistance variable element. In addition, it can be seen that the resistance variable element makes it difficult to change the resistance value if the resistance variable element is left for a long time in a state where data has been written therein, and thus is capable of attaining sufficient data retention characteristic.

Embodiment 2

In this embodiment, as an example of an application of the resistance variable element described in Embodiment 1, a configuration and operation of a resistance variable memory apparatus 200 into which the resistance variable element is incorporated will be described.

[Configuration of Resistance Variable Memory Apparatus 200]

Figure 16:
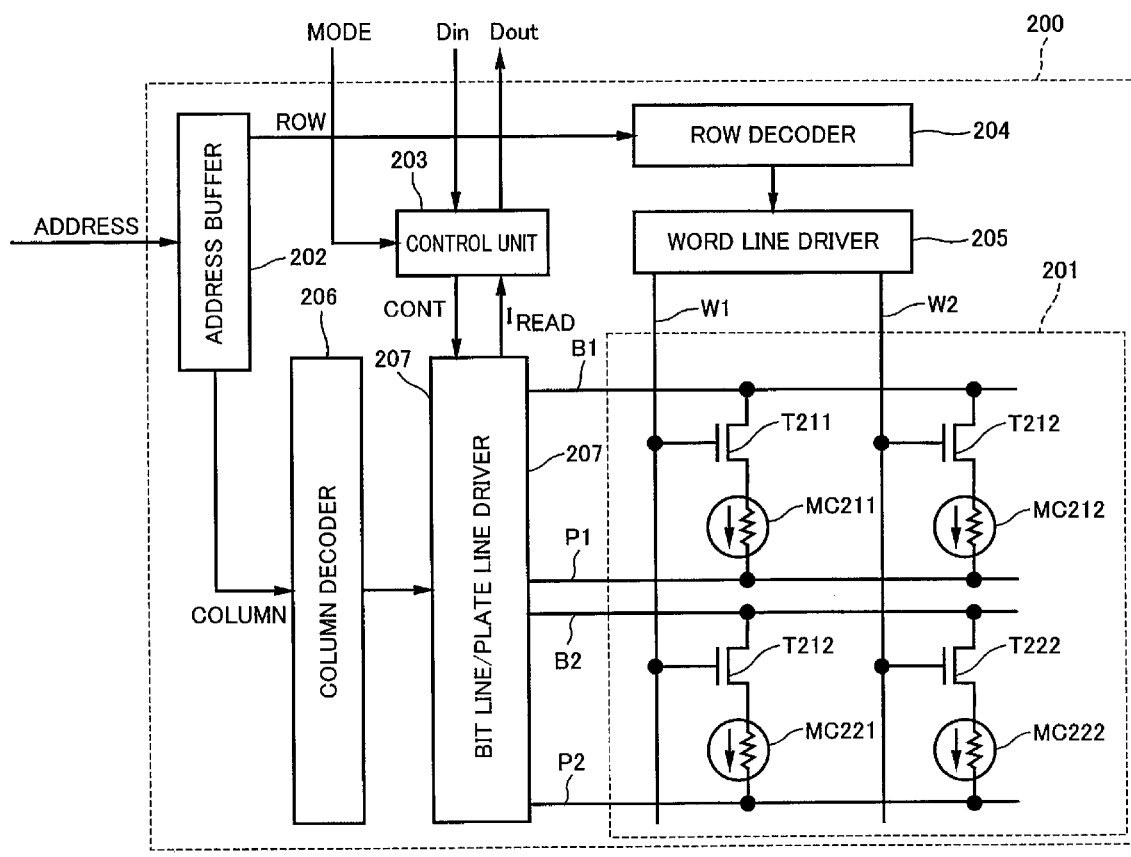
FIG. 16 is a block diagram showing an example of a configuration of a resistance variable memory apparatus according to Embodiment 2 of the present invention.

FIG. 16 is a block diagram showing an example of a configuration of a resistance variable memory apparatus according to Embodiment 2 of the present invention.

The resistance variable memory apparatus 200 comprises a memory array 201, an address buffer 202, a control unit 203 (voltage pulse application device), a row decoder 204, a word line driver 205 (word line drive unit), a column decoder 206, and a bit line/plate line driver 207 (bit line/plate line drive unit).

As shown in FIG. 16, the memory array 201 includes two word lines W1 and W2 extending in a first direction, two bit lines B1 and B2 extending in a second direction so as to respectively cross the word lines W1 and W2, two plate lines P1 and P2 extending in the second direction so as to respectively correspond to the bit lines B1 and B2, four transistors T211, T212, T221, and T222 which are arranged in matrix so as to respectively correspond to cross points between the word lines W1 and W2 and the bit lines B1 and B2, and four memory cells MC211, MC212, MC221, and MC 222 which are arranged in matrix so as to respectively correspond to the transistors T211, T212, T221, and T222. The numbers of the constituents are not limited to those illustrated. Whereas in an example of the resistance variable memory apparatus 200 of FIG. 16, the memory array 201 includes four memory cells MC211, MC212, MC221, and MC222, it may be configured to include five or more memory cells which are arranged in matrix.

Each of the memory cells MC 211, MC212, MC 221, and MC 222 includes the resistance variable element of the present invention, for example, the resistance variable element 10 of FIG. 2 in Embodiment 1.

The transistor T211 and the memory cell MC211 are arranged in series between the bit line B1 and the plate line P1 such that the source (second main terminal) of the transistor 211 is connected to the first terminal 11 (see FIG. 2) of the memory cell 211. To be more specific, the transistor T211 is connected to the bit line B1 and to the memory cell MC211 between the bit line B1 and the memory cell MC211, while the memory cell MC211 is connected to the transistor T211 and to the plate line P1 between the transistor T211 and the plate line P1. The drain (first main terminal) of the transistor T211 is connected to the bit line B1 and a second terminal 12 (see FIG. 2) of the memory cell MC211 is connected to the plate line P1. The gate (control terminal) of the transistor T211 is connected to the word line W1. The source and drain of the transistor T211 may be reversed in connection relationship. That is, the source (first main terminal) may be connected to the bit line B1 and the drain (second main terminal) may be connected to the first terminal 11 of the memory cell 211. The transistor may be, for example, MOS-FET, but may be any other switching device so long as it includes a control terminal, a first main terminal, and a second main terminal.

The other three transistors T212, T221, and T222 and the three memory cells MC212, MC211, and MC222 which are arranged in series with the transistors T212, T221, and T222 are connected to the bit lines and to the plate lines as in the transistor T211 and the memory cell MC211 (see FIG. 16).

In the above structure, upon application of a predetermined voltage (activation voltage) to the gate of each of the transistors T211, T212, T221, and T222 via the word line W1 or the word line W2, the drain and source of each of the transistors T211, T212, T221, and T222 are turned to an electrically-connected state.

An address buffer 202 receives an address signal ADDRESS from an external circuit (not shown), and outputs, based on the address signal ADDRESS, a row address signal ROW to the row decoder 204 and a column address signal COLUMN to the column decoder 206. The address signal ADDRESS is a signal indicating an address of a memory cell selected from among the memory cells MC211, MC212, MC221, and MC222. The row address signal ROW is a signal indicating a row address of the addresses indicated by the address signal ADDRESS and the column address signal COLUMN is a signal indicating a column address of the addresses indicated by the address signal ADDRESS.

The control unit 203 selects one of a write mode (write mode for attaining the low-resistance state or a write mode for attaining the high-resistance state is selected according to the value of Din) or a read mode, according to a mode selection signal MODE received from an external circuit.

In the write mode, the control unit 203 outputs to the bit line/plate line driver 207 a control signal CONT for causing "application of a write voltage pulse for attaining the low-resistance state" or "application of a write voltage pulse for attaining the high-resistance state," according to the input data Din received from the external circuit.

In the read mode, the control unit 203 outputs to the bit line/plate line driver 207 a control signal CONT for causing "application of a read (reproducing) voltage." In addition, in the read mode, the control unit 203 receives a signal $I_{READ}$ output from the bit line/plate line driver 207 and outputs to the external circuit output data Dout indicating a bit value according to the signal $I_{READ}$. The signal $I_{READ}$ is a signal indicating the current value of a current flowing in the plate line P1 or P2 in the read mode.

The row decoder 204 receives the row address signal ROW output from the address buffer 202, and selects one of the two word lines W1 and W2 according to the row address signal ROW. The word line driver 205 applies the activation voltage to the word line selected by the row decoder 204 based on the output signal of the row decoder 204.

The column decoder 206 receives the column address signal COLUMN from the address buffer 202, selects one of the two bit lines B1 and B2 and selects one of the two plate lines P1 and P2 according to the column address signal COLUMN.

Receiving the control signal CONT for causing "application of the write voltage pulse for attaining the low-resistance state" from the control unit 203, the bit line/plate line driver 207 applies a write voltage pulse $V_{WRITELOW}$ (first voltage pulse) for attaining the low-resistance state to the bit line selected by the column decoder 206 based on the output signal of the column decoder 206, and causes the plate line selected by the column decoder 206 to turn to an electrically-grounded state (second voltage pulse).

Receiving the control signal CONT for causing "application of the write voltage pulse for attaining the high-resistance state" from the control unit 203, the bit line/plate line driver 207 applies a write voltage pulse $V_{WRITEHIGH}$ (first voltage pulse) for attaining the high-resistance state to the bit line selected by the column decoder 206 based on the output signal of the column decoder 206, and causes the plate line selected by the column decoder 206 to turn to an electrically-grounded state (second voltage pulse).

Receiving the control signal CONT for causing "application of the read voltage" from the control unit 203, the bit line/plate line driver 207 applies a read voltage $V_{READ}$ (first read voltage) to the bit line selected by the column decoder 206 based on the output signal of the column decoder 206, and causes the plate line selected by the column decoder 206 to turn to an electrically-grounded state (second read voltage). Thereafter, the bit line/plate line driver 207 outputs to the control unit 203 a signal $I_{READ}$ indicating the current value of a current flowing in the selected plate line.

The voltage value of the write voltage pulse $V_{WRITELOW}$ for attaining the low-resistance state is set to, for example, "+2V," and the pulse width thereof is set to, for example, "100 ns." The voltage value of the write voltage pulse $V_{WRITEHIGH}$ for attaining the high-resistance state is set to, for example, "−2V," and the pulse width thereof is set to, for example, "100 ns." The voltage value of the read voltage $V_{READ}$ is set to, for example, "+0.5V."

[Operation of Resistance Variable Memory Apparatus 200]

Subsequently, an example of the operation of the resistance variable memory apparatus 200 shown in FIG. 16 will be described.

The operation of the resistance variable memory apparatus 200 includes a write mode for attaining the low-resistance state, in which "1" is written to the memory cell, a write mode for attaining the high-resistance state, in which "0" is written to the memory cell, and a read mode in which data written in the memory cell is output (reproduced) as output data Dout. Hereinafter, the operations in these modes are sequentially described.

For the sake of explanation, it is supposed that the memory cells MC211, MC212, MC221, and MC222 are initialized to the high-resistance state, and the address signal ADDRESS is a signal indicating the address of the memory cell MC211.

[Write Mode for Attaining Low-Resistance State]

Initially, an example of the operation in the write mode for attaining the low-resistance state of the resistance variable memory apparatus 200 will be described.

When a MODE signal input from the external circuit indicates the write mode, the control unit 203 receives input data Din from the external circuit. When the input data Din is "1," the control unit 203 outputs to the bit line/plate line driver 207 the control signal CONT for causing "application of the write voltage pulse for attaining the low-resistance state."

Then, receiving from the control unit 203, the control signal CONT for causing "application of the write voltage pulse for attaining the low-resistance state," the bit line/plate line driver 207 applies the write voltage pulse $V_{WRITELOW}$ for attaining the low-resistance state to the bit line B1 selected by the column decoder 206. In addition, the bit line/plate line driver 207 causes the plate line P1 selected by the column decoder 206 to turn to be an electrically-grounded state.

In this case, the word line driver 205 applies an activation voltage to the word line W1 selected by the row decoder 204, causing the drain and source of the transistor T211 to turn to an electrically-connected state.

The memory cell MC211 is applied with the write voltage pulse $V_{WRITELOW}$ (positive pulse) for attaining the low-resistance state, with the voltage value being set to "+2V," and the pulse width being set to "100 ns." Thereby, the resistance value of the memory cell MC211 changes from a high-resistance state value to a low-resistance state value. On the other hand, the positive pulse is not applied to the memory cells MC221 and MC222, and the activation voltage is not applied to the gate of the transistor T212 connected in series with the memory cell MC212. Therefore, the resistance states of the memory cells MC212, MC221, and MC222 do not change.

In the manner as described above, only the resistance state of the memory cell MC211 can be changed to the low-resistance state. Thus, 1-bit data indicating "1" corresponding to the low-resistance state is written to the memory cell MC211 (1-bit data can be stored).

When writing to the memory cell MC211 is complete, a new address signal ADDRESS is input to the address buffer 202, and the above described operation in the write mode for attaining the low-resistance state in the resistance variable memory apparatus 200 is repeated for the memory cell other than the memory cell MC211.

[Write Mode for Attaining High-Resistance State]

Subsequently, an example of the operation in the write mode for attaining the high-resistance state in the resistance variable memory apparatus 200 will be described.

When a MODE signal input from the external circuit indicates the write mode, the control unit 203 receives input data Din from the external circuit. When the input data Din is "0," the control unit 203 outputs to the bit line/plate line driver 207 the control signal CONT for causing "application of the write voltage pulse for attaining the high-resistance state."

Then, receiving from the control unit 203, the control signal CONT for causing "application of the write voltage pulse for attaining the high-resistance state," the bit line/plate line driver 207 applies the write voltage pulse $V_{WRITEHIGH}$ for attaining the high-resistance state to the bit line B1 selected by the column decoder 206. In addition, the bit line/plate line driver 207 causes the plate line P1 selected by the column decoder 206 to turn to an electrically-grounded state.

In this case, the word line driver 205 applies an activation voltage to the word line W1 selected by the row decoder 204, causing the drain and source of the transistor T211 to turn to an electrically-connected state.

The memory cell MC211 is applied with the write voltage pulse $V_{WRITEHIGH}$ (negative pulse) for attaining the high-resistance state, with the voltage value being set to "−2V," and the pulse width being set to "100 ns." Thereby, the resistance value of the memory cell MC211 changes from a low-resistance state value to a high-resistance state value. On the other hand, the negative pulse is not applied to the memory cells MC221 and MC222, and the activation voltage is not applied to the gate of the transistor T212 connected in series with the memory cell MC212. Therefore, the resistance states of the memory cells MC212, MC221, and MC222 do not change.

In the manner as described above, only the resistance state of the memory cell MC211 can be changed to the high-resistance state. Thus, 1-bit data indicating "0" corresponding to the high-resistance state is written to the memory cell MC211 (1-bit data can be stored).

When writing to the memory cell MC211 is complete, a new address signal ADDRESS is input to the address buffer 202, and the above described operation in the write mode for attaining the low-resistance state in the resistance variable memory apparatus 200 is repeated for the memory cell other than the memory cell MC211.

[Read Mode]

Subsequently, an example of the operation in the read mode in the resistance variable memory apparatus 200 will be described.

When a MODE signal input from the external circuit indicates the read mode, the control unit 203 outputs to the bit line/plate line driver 207 the control signal CONT for causing "application of a read voltage."

Then, receiving the control signal CONT for causing "application of a read voltage" from the control unit 203, the bit line/plate line driver 207 applies a read voltage $V_{READ}$ to the bit line B1 selected by the column decoder 206. In addition, the bit line/plate line driver 207 causes the plate line P1 selected by the column decoder 206 to turn to an electrically-grounded state.

In this case, the word line driver 205 applies an activation voltage to the word line W1 selected by the row decoder 204, causing the drain and source of the transistor T211 to turn to an electrically-connected state.

Therefore, the memory cell MC211 is applied with a measurement voltage which is the read voltage $V_{READ}$ with the voltage value being set to "+0.5V," so that a current indicating the current value according to the resistance value of the memory cell MC211 flows into the plate line P1 through the memory cell MC211.

Since the measurement voltage is not applied to the memory cells MC221 and MC222, and the activation voltage is not applied to the gate of the transistor T212 connected in series with the memory cell MC212, the current does not flow in the memory cells MC212, MC221, and MC222.

Then, the bit line/plate line driver 207 measures the current value of the current flowing in the plate line P1 and outputs to the control unit 203 a signal $I_{READ}$ indicating the measurement value.

Then, the control unit 203 outputs to outside output data Dout according to the current value indicated by the signal $I_{READ}$. For example, in the case where the current value indicated by the signal $I_{READ}$ is a current value of the current flowing with the memory cell MC211 being in the low-resistance state, the control unit 203 outputs output data Dout indicating "1."

In the manner described above, the current according to the state of the resistance value of the memory cell MC211 can be flowed only in the memory cell MC211, and flows into the plate line P1, so that 1-bit data can be read from (1-bit data can be reproduced from) the memory cell MC211.

When reading from the memory cell MC211 is complete, a new address signal ADDRESS is input to the address buffer 202, and the above described operation in the read mode in the resistance variable memory apparatus 200 is repeated for the memory cell other than the memory cell MC211.

[Effect]

As described above, the resistance variable memory apparatus 200 can be formed by using the memory array 201 into which the resistance variable elements described in Embodiment 1 are incorporated as the memory cells MC211, MC212, MC221, and MC222. As a result, the resistance variable memory apparatus 200 of this embodiment can provide a resistance variable memory apparatus which is manufactured at a low temperature, dispenses with the "forming," changes from the low-resistance state to the high-resistance state at a high write speed, and has high stability.

The resistance variable layer forming the resistance variable element has a multi-crystalline structure rather than an amorphous structure. Therefore, the resistance variable memory apparatus 200 is capable of maintaining reliability of the memory array in a long-time use as compared to the conventional resistance variable memory apparatus.

Embodiment 3

In this embodiment, as an example of an application of the resistance variable memory apparatus 200 described in Embodiment 2, a configuration and operation of a resistance variable apparatus 300 which is Embedded-RAM into which the resistance variable memory apparatus 200 is incorporated will be described.

[Configuration of Resistance Variable Apparatus 300]

Figure 17:
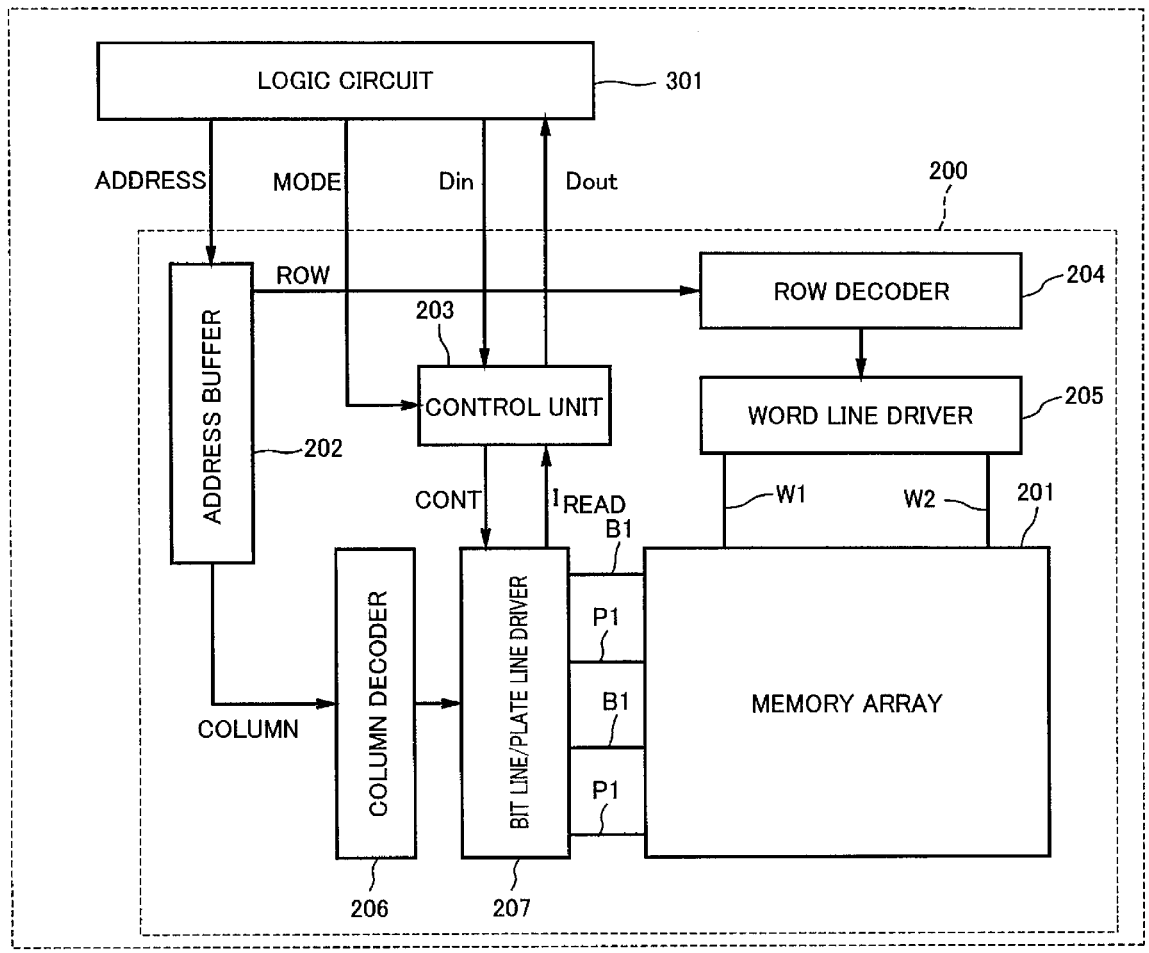
FIG. 17 is a block diagram showing an example of a configuration of a semiconductor integrated circuit (Embedded-RAM) according to Embodiment 3 of the present invention.

FIG. 17 is a block diagram showing an example of a configuration of the resistance variable apparatus (Embedded-RAM) according to Embodiment 3 of the present invention. The resistance variable apparatus 300 includes the resistance variable memory apparatus 200 described in Embodiment 2 (FIG. 17), and a logic circuit 301, and is a circuit formed on one semiconductor chip. The resistance variable memory apparatus 200 is, in this embodiment, used as data RAM. The configuration of the resistance variable memory apparatus 200 has been already described in detail in Embodiment 2, and therefore will not be further described. The logic circuit 301 is a circuit configured to perform a predetermined operation process (e.g., encoding/decoding of audio data and image data), and uses the resistance variable memory apparatus 200 when performing the operation process. That is, the logic circuit 301 is configured to control an address signal ADDRESS and a mode selection signal MODE with respect to the resistance variable memory apparatus 200, thereby carrying out writing/reading of data to/from the resistance variable memory apparatus 200.

[Operation of Resistance Variable Apparatus 300]

Subsequently, the operation of the resistance variable apparatus 300 shown in FIG. 17 will be described. The operation of the resistance variable apparatus 300 includes a write process for attaining the low-resistance state, in which data "1" is written to the resistance variable memory apparatus 200, a write process for attaining the high-resistance state, in which data "0" is written to the resistance variable memory apparatus 200, and a read process in which the data written in the resistance variable memory apparatus 200 is read therefrom. Hereinafter, the operations in the respective processes are sequentially described. Whereas in the operation described below, "write mode for attaining the low-resistance state," "read mode," and "write mode for attaining the high-resistance state" in the resistance variable memory apparatus 200 which have been described in Embodiment 2, are used, the operation of the resistance variable memory apparatus 200 will not be described in detail.

[Write Process]

Initially, a write process in which data is written to the resistance variable memory apparatus 200 which is executed by the resistance variable apparatus 300 will be described.

The logic circuit 301 outputs to the control unit 203 a mode selection signal MODE indicating the "write mode" of the resistance variable memory apparatus 200 to write specified data (e.g., encoded moving picture data, etc) to the resistance variable memory apparatus 200.

Then, the logic circuit 301 sequentially outputs the address signals ADDRESS to the address buffer 202 of the resistance variable memory apparatus 200 to select memory cells to which the specified data is written. Thereby, in the resistance variable memory apparatus 200, the memory cells according to the address signals ADDRESS are sequentially selected.

Then, the logic circuit 301 outputs the specified data, bit by bit, as 1-bit data Din to the control unit 203 of the resistance variable memory apparatus 200.

Then, in the resistance variable memory apparatus 200, the operation similar to that of the write mode for attaining the low-resistance state or the write mode for attaining the high-resistance state as described in Embodiment 2 is selectively performed, according to the value of the input Din. Thereby, the specified data is written to the resistance variable memory apparatus 200 bit by bit.

[Read Process]

Subsequently, a read process in which data is read from the resistance variable memory apparatus 200 which is executed by the resistance variable apparatus 300 will be described.

The logic circuit 301 outputs to the control unit 203 a mode selection signal MODE indicating "read mode" of the resistance variable memory apparatus 200 to read the data written to the resistance variable memory apparatus 200.

Then, the logic circuit 301 sequentially outputs the address signals ADDRESS to the address buffer 202 of the resistance variable memory apparatus 200 to select memory cells from which the written data is read. Thereby, in the resistance variable memory apparatus 200, the memory cells according to the address signals ADDRESS are sequentially selected.

Then, in the resistance variable memory apparatus 200, the operation similar to that in the read mode described in Embodiment 2 is performed. Thereby, the data stored in the resistance variable memory apparatus 200 is read bit by bit as output data Dout.

[Effect]

As described above, the resistance variable apparatus 300 can be formed using the resistance variable memory apparatus 200 described in Embodiment 2. As a result, the resistance variable apparatus 300 of this embodiment can provide a resistance variable memory apparatus which is manufactured at a low temperature, dispenses with the "forming," changes from the low-resistance state to the high-resistance state at a high write speed, and has high stability.

In accordance with the resistance variable apparatus 300 of this embodiment, suitably, a large amount of data can be stored in the resistance variable memory apparatus 200 which has a very high operation speed.

Embodiment 4

In this embodiment, as another example of an application of the resistance variable memory apparatus 200 described in Embodiment 2, a configuration and operation of a resistance variable apparatus 400 which is Reconfigurable-LSI into which the resistance variable memory apparatus 200 is incorporated will be described.

[Configuration of Second Semiconductor Integrated Circuit]

Figure 18:
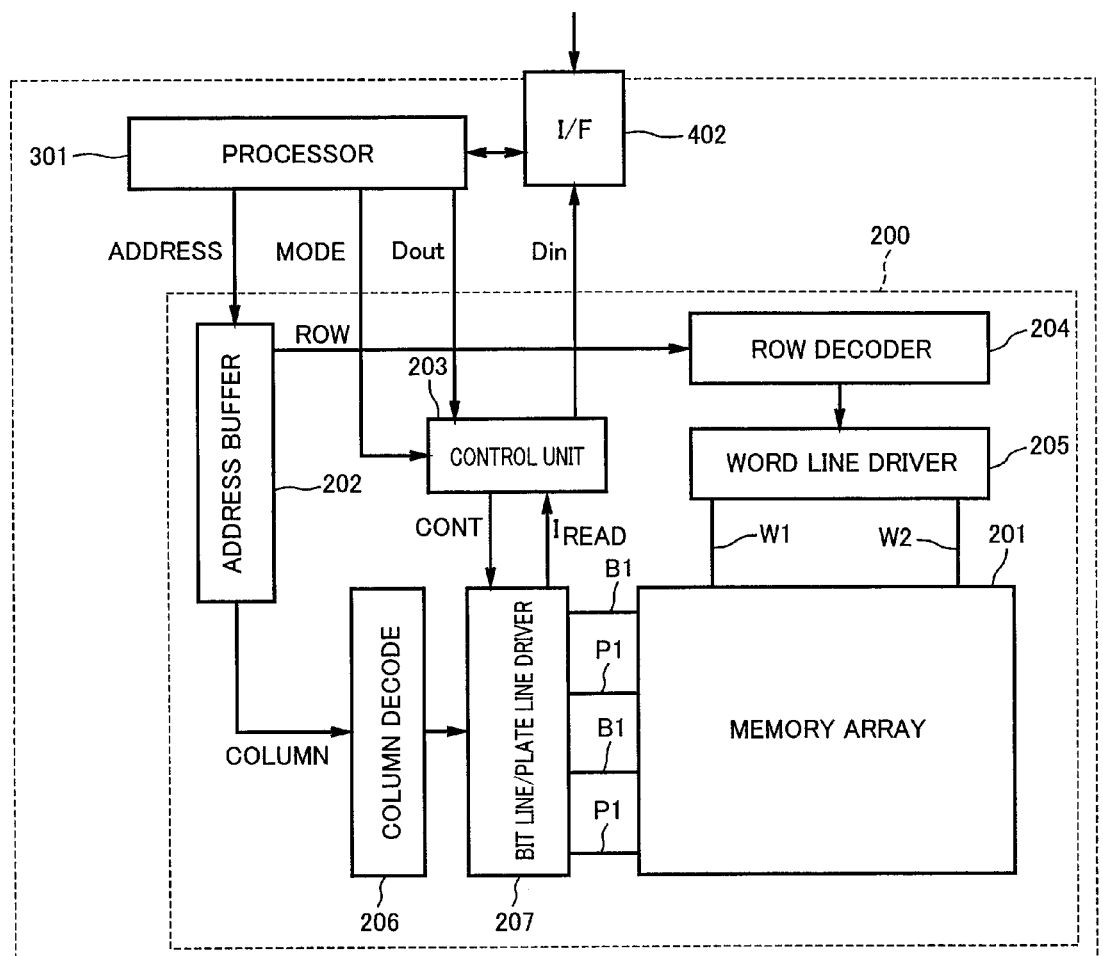
FIG. 18 is a block diagram showing an example of a configuration of a semiconductor integrated circuit (Reconfigurable LSI) according to Embodiment 4 of the present invention.

FIG. 18 is a block diagram showing an example of a configuration of the resistance variable apparatus (Reconfigurable-LSI) according to Embodiment 4 of the present invention.

The resistance variable apparatus 400 includes the resistance variable memory apparatus 200 described in Embodiment 2 (FIG. 16), a processor 401, and an interface 402, which are formed on one semiconductor chip. The resistance variable memory apparatus 200 is used as a program ROM, and is configured to store a program required for the operation of the processor 401. The configuration of the resistance variable memory apparatus 200 has been described in detail in Embodiment 2 and will not be described. The processor 401 operates according to the program stored in the resistance variable memory apparatus 200 and controls the resistance variable memory apparatus 200 and the interface 402. The programs input from the external device (not shown) are sequentially output to the resistance variable memory apparatus 200 via the interface 402.

[Operation of Second Resistance Variable Apparatus 400]

Subsequently, the operation of the semiconductor integrated circuit (Reconfigurable-LSI) 400 shown in FIG. 18 will be described. The operation of the resistance variable apparatus 400 has a program running process (program running mode) for operating according to the stored program and a program rewrite process (program rewrite mode) for rewriting the program stored in the resistance variable memory apparatus 200 into another program. Whereas in the operation described below, the operations in "write mode for attaining the low-resistance state," "read mode," and "write mode for attaining the high-resistance state" in the resistance variable memory apparatus 200 which have been described in Embodiment 2, are used, the operation of the resistance variable memory apparatus 200 will not be described in detail.

[Program Running Mode]

Initially, the operation of the resistance variable apparatus 400 in the program running mode will be described.

The processor 401 outputs to the control unit 203 a mode selection signal MODE indicating "read mode" of the resistance variable memory apparatus 200 to read the program stored in the resistance variable memory apparatus 200.

Then, the processor 401 sequentially outputs the address signals ADDRESS indicating the memory cells to which desired programs are written, to the address buffer 202 of the resistance variable memory apparatus 200. Thereby, in the resistance variable memory apparatus 200, the memory cells according to the address signals ADDRESS are sequentially selected.

Then, in the resistance variable memory apparatus 200, the operation similar to that in the read mode described in Embodiment 2 is performed. Thereby, the program stored in the resistance variable memory apparatus 200 is read bit by bit as output data Dout.

Thus, the processor 401 can perform the predetermined operation process according to the read program.

[Program Rewrite Mode]

Subsequently, the operation in the program rewrite mode of the resistance variable apparatus 400 will be described.

The processor 401 outputs to the control unit 203 a mode selection signal MODE indicating the "write mode" of the resistance variable memory apparatus 200 to rewrite programs (programs which are rewrite targets) stored in the resistance variable memory apparatus 200.

Then, the processor 401 sequentially outputs the address signals ADDRESS indicating the locations of the memory cells in which new programs are to be stored, to the address buffer 202 of the resistance variable memory apparatus 200. Thereby, in the resistance variable memory apparatus 200, the memory cells according to the address signals ADDRESS are sequentially selected.

Then, the processor 401 outputs to the control unit 203 of the resistance variable memory apparatus 200 data bit by bit via the interface 402 from outside. In the resistance variable memory apparatus 200, the operation similar to the operation in the write mode for attaining the low-resistance state or the operation in the write mode for attaining the high-resistance state as described in Embodiment 2 is selectively performed based on the value of the data input from the processor 401. Thereby, the new programs are stored in the resistance variable memory apparatus 200 bit by bit.

Since the resistance variable memory apparatus 200 is a rewritable nonvolatile memory as described above, the programs stored therein can be rewritten and can be preserved even when an electric power supply is turned off. That is, the function implemented in the processor 401 is easily altered. Alternatively, plural programs may be stored in the resistance variable memory apparatus 200 and the function implemented in the processor 401 may be altered according to the read program.

[Effect]

As described above, the resistance variable apparatus 400 can be formed using the resistance variable memory apparatus 200 described in Embodiment 2. As a result, the resistance variable apparatus 400 of this embodiment can provide a resistance variable memory apparatus which is manufactured at a low temperature, dispenses with the "forming," changes from the low-resistance state to the high-resistance state at a high write speed, and has high stability.

The resistance variable apparatus 400 of this embodiment suitably implements different functions (to be so-called reconfigurable) using one processor (LSI), by incorporating resistance variable memory apparatus 200 which has a very high operation speed.

Modifications of Embodiment 2, Embodiment 3, and Embodiment 4

Having illustrated in Embodiment 2, Embodiment 3, and Embodiment 4, the voltage value (+2V) and pulse width (100 ns) of the write voltage pulse $V_{WRITELOW}$ for attaining the low-resistance state and the voltage pulse (−2V) and pulse width (100 ns) of the write voltage pulse $V_{WRITEHIGH}$ for attaining the high-resistance state, other voltage values and pulse widths may be used so long as they meet the conditions required for changing the resistance state of the resistance variable element.

Having described examples in which the resistance variable element described in Embodiment 1 is used as "memory element" in Embodiment 2, Embodiment 3, and Embodiment 4, the applications thereof are not limited to this. For example, in another application of the resistance variable element described in Embodiment 1, the resistance variable element described in Embodiment 1 may be used as a switching element for determining switching of plural signals, a resistance variable element for switching a frequency, a resistance variable element for determining a mixing ratio of plural signals, or a time constant variable element for determining a time constant by combining the resistance variable element with a capacitor.

Whereas it is supposed that the resistance variable element is capable of overwrite in the above description, the resistance state may be read from the resistance variable element and it may be determined whether or not to apply a write pulse prior to writing, or the otherwise, the resistance states of the resistance variable elements which are write targets may be set to initial states prior to writing and then data may be written to desired resistance variable elements, in cases where a correct operation of the resistance variable elements is difficult if data is overwritten.

Embodiment 5

Figure 19:
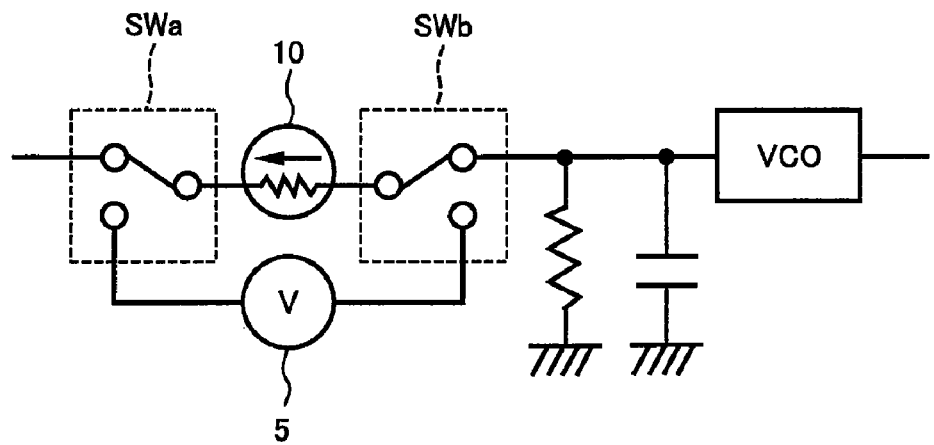
FIG. 19 is a block diagram showing a configuration of a frequency variable circuit using the resistance variable element according to Embodiment 1 of the present invention.
Figure 20:
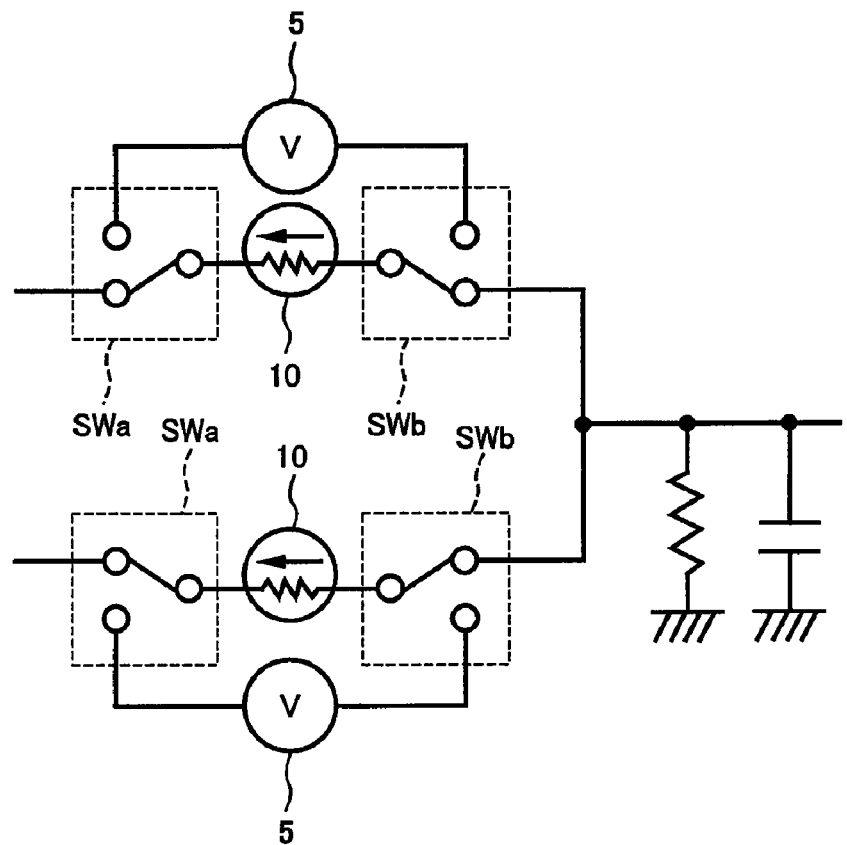
FIG. 20 is a block diagram showing a configuration of a mixing circuit using the resistance variable element according to Embodiment 1 of the present invention.

FIGS. 19 and 20 are block diagrams showing examples of other applications of the resistance variable element which are configured as in the resistance variable element described in Embodiment 1. FIG. 19 is a block diagram showing a configuration of a frequency variable circuit using the resistance variable element according to Embodiment 1 of the present invention. FIG. 20 is a block diagram showing a configuration of a mixing circuit using the resistance variable element according to Embodiment 1 of the present invention. The configuration and operation of elements other than the resistance variable element 10, the electric power supply 5 connected to the resistance variable element 10, and switches SWa and SWb connected to the resistance variable element 10 as shown in FIG. 14 will not be described repetitively. In the figures, VCO indicates a voltage controlled oscillator (oscillator for controlling an oscillation frequency with a voltage [control voltage]).

In the configuration shown in FIGS. 19 and 20, when the resistance value of the resistance variable element 10 is changed, the switches SWa and SWb are switched to electrically connect the resistance variable element 10 to the electric power supply 5. Then, the electric power supply 5 applies a predetermined voltage pulse to the resistance variable element 10. Thereby, the resistance value of the resistance variable element 10 is changed. By returning the switches Swa and Swb to their initial connection states, the resistance value of the resistance variable element 10 can be easily changed. By using the resistance variable element 10 configured in this way, the frequency variable circuit shown in FIG. 19 or the mixing circuit for changing the mixing ratio of two signals shown in FIG. 20 can be formed.

In this embodiment, the above modifications are also applicable.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable element and a resistance variable memory apparatus of the present invention are useful as a resistance variable element, a resistance variable memory apparatus, and a resistance variable apparatus which are manufactured at a low temperature, dispense with "forming," change from a low-resistance state to a high-resistance state at a high write speed, and have high stability.

The invention claimed is:

1. A resistance variable element comprising:
a first electrode;
a second electrode; and
a resistance variable layer which is disposed between the first electrode and the second electrode and is electrically connected to the first electrode and to the second electrode;
wherein the resistance variable layer contains a material having a spinel structure which is expressed as a chemical formula of $(Ni_xFe_{1-x}) Fe_2O_4$, X being not smaller than 0.35 and not larger than 0.9; and
wherein the resistance variable element has a characteristic in which an electric resistance between the first electrode and the second electrode decreases by application of a first voltage pulse having a first voltage between the first electrode and the second electrode and increases by application of a second voltage pulse having a second voltage which is different in polarity from the first voltage between the first electrode and the second electrode.

2. The resistance variable element according to claim 1, wherein the material expressed as the chemical formula has a resistivity which is not smaller than 0.5 Ωcm and not larger than 100 Ωcm.

3. The resistance variable element according to claim 1, wherein at least one of the first electrode and the second electrode is an electrode comprising one or plural materials selected from a group consisting of Ag, Au, Pt, Ru, $RuO_2$, Ir, $IrO_2$, TiO, TiN, TiAlN, Ta, and TaN.

4. The resistance variable element according to claim 1, wherein the resistance variable layer has a thickness which is not smaller than 10 nm and not larger than 200 nm.

5. A resistance variable memory apparatus comprising:
the resistance variable element according to claim 1; and
a voltage pulse application device;
wherein the voltage pulse application device is configured to apply a predetermined voltage pulse between the first electrode and the second electrode to cause 1-bit data or multi-valued data to be stored in the resistance variable element according to a change in the resistance value.

6. The resistance variable memory apparatus according to claim 5, wherein
the voltage pulse application device is configured to apply a positive voltage pulse between the first electrode and the second electrode to cause the resistance variable element to change to the low-resistance state, and to apply a negative voltage pulse between the first electrode and the second electrode to cause the resistance variable element to change to the high-resistance state, to store 1-bit data by causing the data to correspond to the resistance state of the resistance variable element.

7. A resistance variable memory apparatus comprising:
a plurality of word lines extending in a first direction;
a plurality of bit lines extending in a second direction so as to respectively cross the word lines;
a plurality of plate lines extending in the second direction so as to respectively correspond to the plurality of bit lines;
a plurality of transistors each including a first main terminal, a second main terminal and a control terminal, the transistors being provided to respectively correspond to cross points between the word lines and the bit lines;
a plurality of resistance variable elements, each of which includes a first electrode, a second electrode, and a resistance variable layer disposed between the first electrode and the second electrode and electrically connected to the first electrode and to the second electrode, the resistance variable elements respectively corresponding to the transistors one by one;
a word line drive unit which is connected to the plurality of word lines and configured to control application of a voltage to the word lines;
a bit line/plate line drive unit which is connected to the plurality of bit lines and to the plurality of plate lines and configured to control application of a voltage to the bit lines and to the plate lines; and
a control unit configured to control the word line drive unit and the bit line/plate line drive unit; wherein
first main terminals of the transistors are respectively electrically connected to the bit lines extending through associated ones of the cross points;
second main terminals of the transistors are respectively electrically connected to first electrodes of associated ones of the resistance variable elements;
second electrodes of the resistance variable elements are respectively electrically connected to the plate lines extending through associated ones of the cross points;
control terminals of the transistors are respectively electrically connected to the word lines extending through associated ones of the cross points;
the resistance variable layer contains a material having a spinel structure which is expressed as a chemical formula of
$(Ni_xFe_{1-x}) Fe_2O_4$, X being not smaller than 0.35 and not larger than 0.9; and
wherein the resistance variable element has a characteristic in which an electric resistance between the first electrode and the second electrode decreases by application of a first voltage pulse having a first voltage between the first electrode and the second electrode and increases by application of a second voltage pulse having a second voltage which is different in polarity from the first voltage between the first electrode and the second electrode.

8. The resistance variable memory apparatus according to claim 7,
wherein the word line drive unit is configured to selectively apply an activation voltage to one of the word lines which is connected to a gate of a transistor corresponding to a resistance variable element in which specified data is stored based on control of the control unit, the activation voltage causing a drain and a source of the transistor to be in an electrically-connected state; and
wherein the bit line/plate line drive unit is configured to selectively apply a first voltage pulse to one of the bit lines which is connected to the transistor corresponding to the resistance variable element in which the specified data is to be stored based on the control of the control unit and is configured to apply a second voltage pulse to a plate line corresponding to the one of the bit lines based on the control of the control unit.

9. The resistance variable memory apparatus according to claim 7,
wherein the word line drive unit is configured to selectively apply an activation voltage to one of the word lines which is connected to a gate of a transistor corresponding to a resistance variable element from which specified data pre-stored is read based on control of the control unit, the activation voltage causing a drain and a source of the transistor to be in an electrically-connected state; and
wherein the bit line/plate line drive unit is configured to selectively apply a first read voltage to one of the bit lines which is connected to the transistor corresponding to the resistance variable element from which the specified data is read based on the control of the control unit and is configured to apply a second read voltage to a plate line corresponding to the one of the bit lines based on the control of the control unit.

10. A resistance variable apparatus comprising:
the resistance variable memory apparatus according to any one of claims 7 to 9; and
a logic circuit configured to execute an operation process based on specified data; wherein the logic circuit has a write mode and a read mode; and
wherein the logic circuit is configured to, in the write mode, control the resistance variable memory apparatus to cause the data to be stored in the resistance variable memory apparatus, and is configured to, in the read mode, control the resistance variable memory apparatus to cause the data stored in the resistance variable memory apparatus to be read therefrom.

11. A resistance variable apparatus comprising:
the resistance variable memory apparatus according to any one of claims 7 to 9;
an input device for receiving an input from outside; and
a processor which is communicatively connected to the input device;
wherein the resistance variable memory apparatus is configured to store a program;
wherein the processor has a program running mode and a program rewrite mode; and
wherein the processor is configured to, in the program rewrite mode, rewrite the program stored in the resistance variable memory apparatus into a program received from outside via the input device, and is configured to, in the program running mode, to run the program stored in the resistance variable memory apparatus.

12. A method of storing data in a resistance variable element comprising:
applying two kinds of voltage pulses which are different in polarity between the first electrode and the second electrode of the resistance variable element according to claim 1 to change a resistance state of the resistance variable element, to store data in the resistance variable element according to a change in the resistance state.

13. A method of storing data in a resistance variable element comprising:
applying plural kinds of voltage pulses between the first electrode and the second electrode of the resistance variable element according to claim 1 to change a resistance state of the resistance variable element, to store the data in the resistance variable element according to a change in the resistance state; wherein
at least one of the plural kinds of voltage pulses is different in polarity from another voltage pulse.

* * * * *